United States Patent
Tamura et al.

(10) Patent No.: US 10,174,168 B2
(45) Date of Patent: *Jan. 8, 2019

(54) COMPOSITION FOR FORMING PASSIVATION FILM, INCLUDING RESIN HAVING CARBON-CARBON MULTIPLE BOND

(71) Applicant: NISSAN CHEMICAL INDUSTRIES, LTD., Tokyo (JP)

(72) Inventors: Mamoru Tamura, Toyama (JP); Hiroshi Ogino, Toyama (JP); Tomoyuki Enomoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/202,133

(22) Filed: Jul. 5, 2016

(65) Prior Publication Data
US 2016/0311979 A1   Oct. 27, 2016

Related U.S. Application Data

(62) Division of application No. 14/374,668, filed as application No. PCT/JP2013/053067 on Feb. 8, 2013, now abandoned.

(30) Foreign Application Priority Data

Feb. 9, 2012   (JP) .................. 2012-026075

(51) Int. Cl.
| | | |
|---|---|---|
| C08G 8/02 | (2006.01) |
| C08G 65/40 | (2006.01) |
| C08G 65/48 | (2006.01) |
| C08G 75/20 | (2016.01) |
| H01L 21/02 | (2006.01) |
| H01L 21/56 | (2006.01) |
| H01L 23/29 | (2006.01) |
| H01L 23/31 | (2006.01) |
| H01L 23/48 | (2006.01) |
| H01L 29/06 | (2006.01) |
| C09D 161/16 | (2006.01) |
| C09D 171/12 | (2006.01) |
| C09D 181/06 | (2006.01) |
| H01L 21/768 | (2006.01) |

(52) U.S. Cl.
CPC ............. C08G 75/20 (2013.01); C08G 8/02 (2013.01); C08G 65/40 (2013.01); C08G 65/48 (2013.01); C09D 161/16 (2013.01); C09D 171/12 (2013.01); C09D 181/06 (2013.01); H01L 21/02118 (2013.01); H01L 21/02318 (2013.01); H01L 21/56 (2013.01); H01L 21/76898 (2013.01); H01L 23/293 (2013.01); H01L 23/3171 (2013.01); H01L 23/481 (2013.01); H01L 29/06 (2013.01); H01L 2924/0002 (2013.01)

(58) Field of Classification Search
CPC ........ C08G 65/40; C08G 75/23; C08G 75/20; C09D 181/06
USPC ............................. 528/86, 374, 373
See application file for complete search history.

(56) References Cited

U.S. PATENT DOCUMENTS 4,973,663 A * 11/1990 Tamai ............... C08G 75/0222
528/362
5,179,188 A   1/1993  Mercer et al.
(Continued)

FOREIGN PATENT DOCUMENTS

CN   103068947 A   4/2013
JP   H09-214141 A   8/1997
(Continued)

OTHER PUBLICATIONS

International Search Report issued in International Patent Application No. PCT/JP2013/053067 dated May 7, 2013.
(Continued)

Primary Examiner — Shane Fang
(74) Attorney, Agent, or Firm — Oliff PLC

(57) ABSTRACT

There is provided a composition for forming a passivation film that satisfies electric insulation, heat-tolerance, solvent-tolerance, and a dry etch back property at the same time. A composition for forming a passivation film, including: a polymer containing a unit structure of Formula (i):

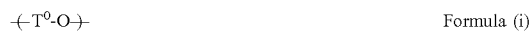

Formula (i)

(where $T^0$ is a sulfonyl group, a fluoroalkylene group, a cycloalkylene group, or an arylene group having a substituent, or is a combination of an arylene group optionally having a substituent and a fluoroalkylene group or a cycloalkylene group), wherein the polymer has at least one of a group having a structure of Formula (2-A), a group having a structure of Formula (2-B), or a group having both of the structures, at an end, in a side chain, or in a main chain of the polymer:

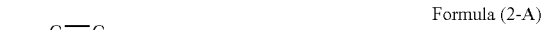

Formula (2-A)

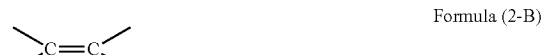

Formula (2-B)

The polymer may contain a unit structure of Formula (1):

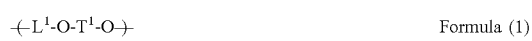

Formula (1)

12 Claims, No Drawings

(56) References Cited

U.S. PATENT DOCUMENTS

| | | |
|---|---|---|
| 5,830,563 A | 11/1998 | Shimoto et al. |
| 6,388,044 B1 | 5/2002 | Yoshida et al. |
| 2003/0171527 A1 | 9/2003 | Burgoyne |
| 2003/0187177 A1 | 10/2003 | Yokota |

FOREIGN PATENT DOCUMENTS

| | | |
|---|---|---|
| JP | 2001-151884 A | 6/2001 |
| JP | 2002-088149 A | 3/2002 |
| JP | 2003-268101 A | 9/2003 |
| JP | 2005-264008 A | 9/2005 |
| JP | 2006-312738 A | 11/2006 |
| JP | 2009-070875 A | 4/2009 |
| JP | 2010-065097 A | 3/2010 |
| JP | 2013-035959 A | 2/2013 |
| JP | 2013-049762 A | 3/2013 |
| WO | 2006/137369 A1 | 12/2006 |

OTHER PUBLICATIONS

Written Opinion of the International Searching Authority issued in International Patent Application No. PCT/JP2013/053067 dated May 7, 2013.

Jun. 30, 2015 Office Action issued in Chinese Application No. 201380003965.X.

\* cited by examiner

COMPOSITION FOR FORMING PASSIVATION FILM, INCLUDING RESIN HAVING CARBON-CARBON MULTIPLE BOND

This is a Divisional of application Ser. No. 14/374,668 filed Jul. 25, 2014, which is a National Stage Application of PCT/JP2013/053067 filed Feb. 8, 2013, which claims the benefit of Japanese Application No. 2012-026075 (filed Feb. 9, 2012). The entire disclosures of the prior applications are hereby incorporated by reference herein their entireties.

TECHNICAL FIELD

The present invention relates to an insulating film and particularly to a passivation film protecting an electrode on the rear surface of a wafer formed by the through silicon via (TSV) technology in a step in which lamination bodies such as semiconductor products, for example, IC chips, and optical products are formed.

BACKGROUND ART

In recent years, highly integrated semiconductor devices, smaller mounted areas, and lowering interconnection resistances by reducing interconnection distances have been in high demand due to high-performance and compact electron equipment, such as cell-phones and IC cards. To obtain these, stack structures in which semiconductor elements are stacked in a vertical direction have been developed.

One example of methods for producing stack structures is a method including steps of: thinning a wafer on which a semiconductor element is formed; providing a through-hole with a technique such as anisotropic dry etching (through silicon via: TSV technique); forming an electrode on the rear surface of the wafer by filling the through-hole with a conductive material such as copper; forming a passivation film on the rear surface having an electrode; and electrically joining the wafer and a chip or the surface of a wafer on which another semiconductor element is formed.

In the steps above, the insulating film formed on the rear surface of a wafer is required to be electrically insulative to prevent current leakage and migration of a conductive material, to be solvent-tolerant and have a good dry etch back property in a photolithography step that is to open an electrode portion after forming a passivation film, and to be heat-tolerant in an electrode-joining step.

Examples of well-known passivation films include benzocyclobutene resins, polyimides, and fully aromatic polyethers.

However, benzocyclobutene resins require a fluorine gas to be used for dry etch back in a photolithography step, and thus electrodes and wafers may be damaged. In addition, cross-linking reaction does not sufficiently proceed at a curing temperature around 200° C., and a good solvent-tolerance cannot be obtained.

In contrast, as for polyimides, thinned wafers may be damaged because the film-forming temperature is 300° C. or higher, and shrinkage of films upon curing results in remaining stresses.

Fully aromatic polyethers have no heat cross-linking portion, and thus are not highly tolerant of solvents. In addition, resins may be melted in joining electrodes because the resins have low softening points.

A substrate for a thick film technique has been disclosed (Patent Document 1). In the substrate, an undercoat film containing 30% by volume to 45% by volume of a polyether ether ketone resin powder and a thermosetting resin is formed on an inorganic insulating substrate that is a glass base material impregnated with a silicone resin.

Covering products, such as an adhesive for flexible printed-circuit boards, that contain a polymer having a main chain composed of a polyimide, and having a functional group having a carbon-carbon triple bond at an end thereof, have been disclosed (Patent Document 2).

Covering products, such as an adhesive composition containing a polymer having a main chain containing a functional group having a phenyl group, urea, an amido group and the like, and a carbon-carbon triple bond, have been disclosed (Patent Document 3). Covering products, such as an adhesive composition containing a polymer containing polyether ether sulfone having a sulfonic acid group, and containing polyether ether ketone, have been disclosed (Patent Document 4).

PRIOR ART DOCUMENTS

Patent Documents

Patent Document 1: Japanese Patent Application Publication No. 2009-070875 (JP 2009-070875 A)
Patent Document 2: WO 2006-137369
Patent Document 3: Japanese Patent Application Publication No. 2010-065097 (JP 2010-065097 A)
Patent Document 4: Japanese Patent Application Publication No. 2005-264008 (JP 2005-264008 A)

SUMMARY OF THE INVENTION

Problem to be Solved by the Invention

In view of the above-described disadvantages, it is an object of the present invention to provide a composition for forming a passivation film that satisfies electric insulation, heat-tolerance, solvent-tolerance, and a dry etch back property at the same time.

Means for Solving the Problem

The present invention provides: as a first aspect, a composition for forming a passivation film, comprising: a polymer containing a unit structure of Formula (i):

    Formula (i)

(where $T^0$ is a sulfonyl group, a fluoroalkylene group, a cycloalkylene group, or an arylene group having a substituent, or is a combination of an arylene group optionally having a substituent and a fluoroalkylene group or a cycloalkylene group), in which the polymer has at least one of a group having a structure of Formula (2-A), a group having a structure of Formula (2-B), or a group having both of the structures, at an end, in a side chain, or in a main chain of the polymer:

    Formula (2-A)

    Formula (2-B)

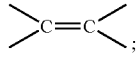

as a second aspect, a composition for forming a passivation film, comprising: a polymer containing a unit structure of Formula (1):

    Formula (1)

(where $L^1$ is an arylene group optionally having a substituent, or is a combination of an arylene group optionally having a substituent and a sulfonyl group, a carbonyl group, an ester group, an amido group, a sulfinyl group, or a sulfonamide group; and $T^1$ is a fluoroalkylene group, a cycloalkylene group, or an arylene group having a substituent, or is a combination of an arylene group optionally having a substituent and a fluoroalkylene group or a cycloalkylene group, or is a combination of an arylene group optionally having a substituent, a fluoroalkylene group, and a cycloalkylene group), in which the polymer has at least one of a group having a structure of Formula (2-A), a group having a structure of Formula (2-B), or a group having both of the structures, at an end, in a side chain, or in a main chain of the polymer:

Formula (2-A)

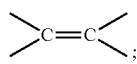

Formula (2-B)

as a third aspect, the composition for forming a passivation film according to the first aspect or the second aspect, in which the arylene group is a phenylene group, a naphthylene group, or an anthrylene group;

as a fourth aspect, the composition for forming a passivation film according to any one of the first aspect to the third aspect, in which the polymer is a homopolymer having one type of unit structure;

as a fifth aspect, the composition for forming a passivation film according to any one of the first aspect to the third aspect, in which the polymer is a copolymer having at least two types of unit structures;

as a sixth aspect, the composition for forming a passivation film according to any one of the second aspect to the fifth aspect, comprising: a polymer containing a unit structure of Formula (1) where $L^1$ is a group of Formula (3) below, a unit structure of Formula (1) where $L^1$ is a group of Formula (4) below, or a combination of these unit structures:

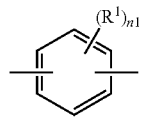

Formula (3)

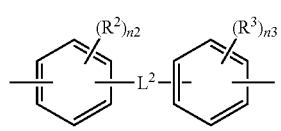

Formula (4)

(where each of $R^1$, $R^2$, and $R^3$ is a $C_{1-10}$ alkyl group, a $C_{1-4}$ fluoroalkyl group, a hydroxy group, an allyl group, an allyloxy group, an amino group, a cyano group, a nitro group, an acyl group, an acyloxy group, a carboxy group, a group having a tertiary carbon atom, a cycloalkyl group, or a combination of any of these groups; $L^2$ is a sulfonyl group, a carbonyl group, an ester group, an amido group, a sulfinyl group, or a sulfonamide group; and each of n1, n2, and n3 is an integer of 0 to 4);

as a seventh aspect, the composition for forming a passivation film according to any one of the second aspect to the sixth aspect, comprising: a polymer containing a unit structure of Formula (1) where $T^1$ is a group of Formula (5) below, a unit structure of Formula (1) where $T^1$ is a group of Formula (6) below, or a combination of these unit structures:

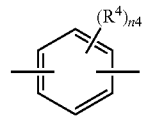

Formula (5)

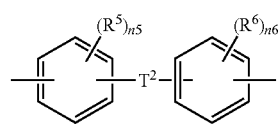

Formula (6)

(where each of $R^4$, $R^5$, and $R^6$ is a $C_{1-10}$ alkyl group, a $C_{1-4}$ fluoroalkyl group, a hydroxy group, an allyl group, an allyloxy group, an amino group, a cyano group, a nitro group, an acyl group, an acyloxy group, a carboxy group, a group having a tertiary carbon atom, a cycloalkyl group, or a combination of any of these groups; $T^2$ is a fluoroalkylene group, a cycloalkylene group, or a combination of these groups; and each of n4, n5, and n6 is an integer of 0 to 4);

as an eighth aspect, the composition for forming a passivation film according to the sixth aspect, in which, in Formula (3), $R^1$ is a group containing at least a cyano group, and n1 is an integer of 1 to 4;

as a ninth aspect, the composition for forming a passivation film according to the sixth aspect, in which, in Formula (4), $L^2$ is a sulfonyl group or a carbonyl group;

as a tenth aspect, the composition for forming a passivation film according to any one of the first aspect to the ninth aspect, further comprising: a polymer containing a unit structure of Formula (7):

Formula (7)

(where $L^3$ is Formula (3) or Formula (4):

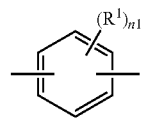

Formula (3)

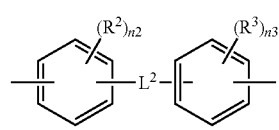

Formula (4)

(where each of R, $R^2$, and $R^3$ is a $C_{1-10}$ alkyl group, a $C_{1-4}$ fluoroalkyl group, a hydroxy group, an allyl group, an allyloxy group, an amino group, a cyano group, a nitro group, an acyl group, an acyloxy group, a carboxy group, a group having a tertiary carbon atom, a cycloalkyl group, or a combination of any of these groups; $L^2$ is a sulfonyl group, a carbonyl group, an ester group, an amido group, a sulfinyl group, or a sulfonamide group; and each of n1, n2, and n3 is an integer of 0 to 4), $T^3$ is an alkylene group, a sulfonyl group, a carbonyl group, a $C_{6-30}$ arylene group optionally having a substituent, or a combination of any of these groups);

as a eleventh aspect, the composition for forming a passivation film according to any one of the first aspect to the tenth aspect, in which the arylene group is a phenylene group, a naphthylene group, or an anthrylene group;

as a twelfth aspect, the composition for forming a passivation film according to the tenth aspect or the eleventh aspect, in which $T^3$ is a group of Formula (8):

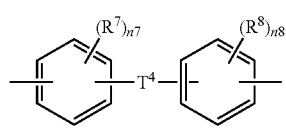

Formula (8)

(where each of $R^7$ and $R^8$ is a $C_{1-10}$ alkyl group, a $C_{1-4}$ fluoroalkyl group, a hydroxy group, an allyl group, an allyloxy group, an amino group, a cyano group, a nitro group, an acyl group, an acyloxy group, a carboxy group, a group having a tertiary carbon atom, a cycloalkyl group, or a combination of any of these groups; each of n7 and n8 is an integer of 0 to 4; and $T^4$ is an alkylene group, a sulfonyl group, a carbonyl group, a $C_{6-30}$ arylene group optionally having a substituent, or a combination of any of these groups);

as a thirteenth aspect, the composition for forming a passivation film according to any one of the sixth aspect to the eleventh aspect, in which the group having a tertiary carbon atom is a tertiary butyl group;

as a fourteenth aspect, the composition for forming a passivation film according to any one of the first aspect to the twelfth aspect, in which weight-average molecular weight of the polymer is from 500 to 5,000,000;

as a fifteenth aspect, the composition for forming a passivation film according to any one of the first aspect to the fourteenth aspect, further comprising: a solvent; as a sixteenth aspect, a passivation film obtained by applying the composition for forming a passivation film as described in any one of the first aspect to the fifteenth aspect to a substrate, and baking the substrate;

as a seventeenth aspect, the passivation film according to the sixteenth aspect, in which the passivation film is used as a film protecting an IC circuit formed on a wafer; and as an eighteenth aspect, the passivation film according to the sixteenth aspect, in which the passivation film is used as a film protecting an electrode formed on a rear surface of a wafer.

Effects of the Invention

According to the present invention, the use of the above-described composition including a polymer having a polyether structure, such as a polyether ether ketone, a polyether ether sulfone, and a polyether ether arylene as a composition for forming a passivation film, allows an insulating film having good electric insulation, heat-tolerance, solvent-tolerance, and a dry etch back property to be formed.

MODES FOR CARRYING OUT THE INVENTION

A composition for forming a passivation film of the present invention includes a polymer containing a unit structure of Formula (i) where the polymer has at least one of a group having a structure of Formula (2-A), a group having a structure of Formula (2-B), or a group having both of the structures, at the end, in the side chain, or in the main chain of the polymer.

The composition for forming a passivation film of the present invention includes: a polymer containing a unit structure of Formula (i) where the polymer has at least one of a group having a structure of Formula (2-A), a group having a structure of Formula (2-B), or a group having both of the structures, at the end, in the side chain, or in the main chain of the polymer; and a solvent, and may further include an additional resin, a stabilizer, a colorant, a surfactant and the like as optional components.

A composition for forming a passivation film of the present invention includes a polymer containing a unit structure of Formula (1) where the polymer has at least one of a group having a structure of Formula (2-A), a group having a structure of Formula (2-B), or a group having both of the structures, at the end, in the side chain, or in the main chain of the polymer.

The composition for forming a passivation film of above includes: a polymer containing a unit structure of Formula (1) where the polymer has at least one of a group having a structure of Formula (2-A), a group having a structure of Formula (2-B), or a group having both of the structures, at the end, in the side chain, or in the main chain of the polymer; and a solvent, and may further include an additional resin, a stabilizer, a colorant, a surfactant and the like as optional components.

As described later, in a polymer used for the present invention, a hydroxy group or an amino group contained in the polymer (at the end, or in the side chain) is converted to an organic group containing a multiple bond consisting of a group having a structure of Formula (2-A), a group having a structure of Formula (2-B), or a group having both of the structures, and a polymer having a conversion rate of 100% can be used. However, considering an electrical property, solubility to a solvent, adhesiveness and the like, the conversion rate can be within a range of, for example, 30% to 99%, 60% to 99%, or 70% to 95%.

The solid content of a composition for forming a passivation film of the present invention is within a range of 0.1% to 80% by mass, and preferably 1% to 60% by mass. The solid content is a percentage of a residual after removing a solvent from the composition for forming a passivation film. A percentage of a polymer containing a unit structure of Formula (1) in the solid content can be 30% to 100% by mass, and preferably 50% to 100% by mass.

A polymer used for the present invention is preferably a thermosetting resin.

The structure of Formula (2-A) is a carbon-carbon triple bond, and the structure of Formula (2-B) is a carbon-carbon double bond. At the end, or in the side chain of a polymer, these structures exist as the structures of Formulae below, respectively,

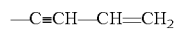

and in the main chain of a polymer, these structures exist as a structure of Formula (2-A) and a structure of Formula (2-B), respectively.

Such carbon-carbon triple bonds are considered to be dimerized or trimerized with heating (for example, at 400° C. or above) to form a sequential unsaturated bond (for example, a diene structure) or an aromatic ring structure, and whereby polymer molecules are cross-linked with each other.

Such carbon-carbon double bonds are also considered to be dimerized with heating to form a cross-linked structure by cyclization.

The weight-average molecular weight of the polymer used for the present invention is within a range of 500 to 5,000,000, preferably 1,000 to 1,000,000, and preferably 1,000 to 100,000.

In Formula (i), $T^0$ is a sulfonyl group, a fluoroalkylene group, a cycloalkylene group, or an arylene group having a substituent, or is a combination of an arylene group optionally having a substituent and a fluoroalkylene group or a cycloalkylene group.

In Formula (1), $L^1$ is an arylene group optionally having a substituent, or is a combination of an arylene group optionally having a substituent and a sulfonyl group or a carbonyl group; and $T^1$ is a fluoroalkylene group, a cycloalkylene group, or an arylene group having a substituent, or is a combination of an arylene group optionally having a substituent and a fluoroalkylene group or a cycloalkylene group.

Examples of an arylene group having a substituent include an arylene group having a substituent that will be described later.

A combination of an arylene group optionally having a substituent and a fluoroalkylene group or a cycloalkylene group means a combination of a substituted or unsubstituted arylene group and a fluoroalkylene group, or a combination of a substituted or unsubstituted arylene group and a cycloalkylene group.

Examples of an arylene group include a phenylene group, a naphthyl group, and an anthryl group. Of these, a phenylene group and a naphthyl group can preferably be used.

Examples of the fluoroalkylene group include $C_{1-10}$ fluoroalkylene groups. The fluoroalkylene group usable includes a group completely fluorinated (perfluorinated), and an alkylene group partially fluorinated (monofluorinated, difluorinated and the like). Specific examples thereof include a fluoromethylene group, a fluoroethylene group, a fluoro-n-propylene group, a fluoroisopropylene group, a fluoropropane-2,2-diyl group, a fluoro-n-butylene group, a fluoroisobutylene group, a fluoro-s-butylene group, and a fluoro-t-butylene group. Among them, $C_{1-4}$ fluoroalkylene groups such as a perfluoropropane-2,2-diyl group are preferable.

Examples of a cycloalkylene group include $C_{3-30}$ cycloalkylene groups, such as a cyclopropylene group, a cyclobutylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-i-propyl-cyclopropylene group, a 2-i-propyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, and a 2-ethyl-3-methyl-cyclopropylene group. A divalent organic group derived from adamantan or norbornene can also be used.

In the polymer containing a unit structure of Formula (1), which is used for the present invention, the above-explained functional groups can be used alone or in combination of plural types for each of $L^1$ and $T^1$.

The polymer used for the present invention can be used as a homopolymer having one type of unit structure, or can be used as a copolymer having two or more types of unit structures.

The present invention can include a polymer containing a unit structure of Formula (1) where $L^1$ is a group of Formula (3) and/or Formula (4).

Specifically, a composition for forming a passivation film of the present invention can comprise a polymer containing a unit structure of Formula (1) where $L^1$ is a group of Formula (3), a unit structure of Formula (1) where L is a group of Formula (4), or a combination of these unit structures.

In Formulae (3) and (4), each of $R^1$, $R^2$, and $R^3$ is a $C_{1-10}$ alkyl group, a $C_{1-4}$ fluoroalkyl group, a hydroxy group, an allyl group, an allyloxy group, an amino group, a cyano group, a nitro group, an acyl group, an acyloxy group, a carboxy group, a group having a tertiary carbon atom, a cycloalkyl group, or a combination of any of these groups; $L^2$ is a sulfonyl group, a carbonyl group, an ester group, an amido group, a sulfinyl group, or a sulfonamide group; and each of n1, n2, and n3 is an integer of 0 to 4.

Examples of the $C_{1-10}$ alkyl group include a methyl group, an ethyl group, an n-propyl group, an i-propyl group, an n-butyl group, an i-butyl group, an s-butyl group, a t-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group.

The $C_{1-4}$ fluoroalkyl group usable includes a group completely fluorinated (perfluorinated), and an alkyl group partially fluorinated (monofluorinated, difluorinated and the like). Specific examples thereof include a fluoromethyl group, a fluoroethyl group, a fluoro-n-propyl group, a fluoroisopropyl group, a fluoro-n-butyl group, a fluoroisobutyl group, a fluoro-s-butyl group, and a fluoro-t-butyl group.

Examples of the acyl group include $C_{2-10}$ acyl groups, such as a methylcarbonyl group, an ethylcarbonyl group, an n-propylcarbonyl group, an i-propylcarbonyl group, a cyclopropylcarbonyl group, an n-butylcarbonyl group, an i-butylcarbonyl group, an s-butylcarbonyl group, a t-butylcarbonyl group, a cyclobutylcarbonyl group, a 1-methyl-cyclopropylcarbonyl group, a 2-methyl-cyclopropylcarbonyl group, an n-pentylcarbonyl group, a 1-methyl-n-butylcarbonyl group, a 2-methyl-n-butylcarbonyl group, a 3-methyl-n-butylcarbonyl group, a 1,1-dimethyl-n-propylcarbonyl group, a 1,2-dimethyl-n-propylcarbonyl group, a 2,2-dimethyl-n-propylcarbonyl group, a 1-ethyl-n-propylcarbonyl group, a cyclopentylcarbonyl group, a 1-methyl-cyclobutylcarbonyl group, a 2-methyl-cyclobutylcarbonyl group, a 3-methyl-cyclobutylcarbonyl group, a 1,2-dimethyl-cyclopropylcarbonyl group, a 2,3-dimethyl-cyclopropylcarbonyl group, a 1-ethyl-cyclopropylcarbonyl group, a 2-ethyl-cyclopropylcarbonyl group, an n-hexylcarbonyl group, a 1-methyl-n-pentylcarbonyl group, a 2-methyl-n-pentylcarbonyl group, a 3-methyl-n-pentylcarbonyl group, a 4-methyl-n-pentylcarbonyl group, a 1,1-dimethyl-n-butylcarbonyl group, a 1,2-dimethyl-n-butylcarbonyl group, a 1,3-dimethyl-n-butylcarbonyl group, a 2,2-dimethyl-n-butylcarbonyl group, a 2,3-dimethyl-n-butylcarbonyl group, a 3,3-dimethyl-n-butylcarbonyl group, a 1-ethyl-n-butylcarbonyl group, a 2-ethyl-n-butylcarbonyl group, and a 1,1,2-trimethyl-n-propylcarbonyl group.

Examples of the acyloxy group include $C_{2-10}$ acyloxy groups, such as a methylcarbonyloxy group, an ethylcarbonyloxy group, an n-propylcarbonyloxy group, an i-propylcarbonyloxy group, a cyclopropylcarbonyloxy group, an n-butylcarbonyloxy group, an i-butylcarbonyloxy group, an s-butylcarbonyloxy group, a t-butylcarbonyloxy group, a cyclobutylcarbonyloxy group, a 1-methyl-cyclopropylcarbonyloxy group, a 2-methyl-cyclopropylcarbonyloxy group, an n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, a cyclopentylcarbonyloxy group, a 1-methyl-cyclobutylcarbonyloxy group, a 2-methyl-cyclobutylcarbonyloxy group, a 3-methyl-cyclobutylcarbonyloxy group, a 1,2-dimethyl-cyclopropylcarbonyloxy group, a 2,3-dimethyl-cyclopropylcarbonyloxy group, a 1-ethyl-cyclopropylcarbonyloxy group, a 2-ethyl-cyclopropylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butylcarbonyloxy group, a 2-ethyl-n-butylcarbonyloxy group, and a 1,1,2-trimethyl-n-propylcarbonyloxy group.

In the present invention, a group having a tertiary carbon atom is a functional group having a tertiary carbon atom. The functional group is substituted with a hydrogen atom on a carbon atom to produce a quaternary carbon. Examples of an organic group bonded to carbon of the tertiary carbon atom include alkyl groups, such as a methyl group, an ethyl group, and a propyl group; and aryl groups such as a phenyl group. Among them, a methyl group is preferably used, and a tertiary butyl group having three methyl groups is preferably used.

Examples of a cycloalkyl group include $C_{3-30}$ cycloalkyl groups, such as a cyclopropyl group, a cyclobutyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methy-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group. A monovalent organic group derived from adamantan or norbornene can also be used.

Examples of the substituent described above include a $C_{1-10}$ alkyl group, a $C_{1-4}$ fluoroalkyl group, a hydroxy group, an allyl group, an allyloxy group, an amino group, a cyano group, a nitro group, an acyl group, an acyloxy group, a carboxy group, and a group having a tertiary carbon atom, a cycloalkyl group. Specific examples of these groups are the same as respective examples described above.

A structure of Formula (3) where $R^1$ is a group containing at least a cyano group, and n1 is an integer of 1 to 4, can be used.

A structure of Formula (4) where $L^2$ is a sulfonyl group or a carbonyl group, can be used.

With or without the choice for $L^1$ described above, a polymer usable for the present invention may contain a unit structure of Formula (1) where $T^1$ is a group of Formula (5), a unit structure of Formula (1) where $T^1$ is a group of Formula (6), or a combination of these unit structures.

Specifically, a polymer usable may contain a unit structure of Formula (1) where $L^1$ is a group of Formula (3), a unit structure of Formula (1) where L is a group of Formula (4), a unit structure of Formula (1) where $T^1$ is a group of Formula (5), a unit structure of Formula (1) where $T^1$ is a group of Formula (6), a unit structure of Formula (1) where $L^1$ is a group of Formula (3) and $T^1$ is a group of Formula (5), a unit structure of Formula (1) where $L^1$ is a group of Formula (3) and $T^1$ is a group of Formula (6), a unit structure of Formula (1) where $L^1$ is a group of Formula (4) and $T^1$ is a group of Formula (5), a unit structure of Formula (1) where $L^1$ is a group of Formula (4) and $T^1$ is a group of Formula (6), or a combination of any of these unit structures.

In Formulae (5) and (6), each of $R^4$, $R^5$, and $R^6$ is a $C_{1-10}$ alkyl group, a $C_{1-4}$ fluoroalkyl group, a hydroxy group, an allyl group, an allyloxy group, an amino group, a cyano group, a nitro group, an acyl group, an acyloxy group, a carboxy group, a group having a tertiary carbon atom, a cycloalkyl group, or a combination of any of these groups; and each of n4, n5, and n6 is an integer of 0 to 4. $T^2$ is a fluoroalkylene group, a cycloalkylene group, or a combination of these groups.

Examples of a $C_{1-10}$ alkyl group, a $C_{1-4}$ fluoroalkyl group, an acyl group, an acyloxy group, a group having a tertiary carbon atom, and a cycloalkyl group are the same as respective examples described above.

Examples of a fluoroalkylene group and a cycloalkylene group are the same as respective examples described above, and these can be used alone, or can be used in combination.

A copolymer containing a unit structure of Formula (1) and a unit structure of Formula (7) can be used for the present invention.

In Formula (7), $L^3$ is a group of Formula (3) or Formula (4), and $T^3$ is an alkylene group, a sulfonyl group, a carbonyl group, a $C_{6-30}$ arylene group optionally having a substituent, or a combination of any of these groups. Examples of the arylene group and the alkylene group are the same as respective examples described above.

In Formula (7), a substituted or unsubstituted phenylene group or a naphthylene group can be used as an arylene group. In Formula (7), examples of the alkylene group include $C_{1-10}$ alkylene groups, such as a methylene group, an ethylene group, a propylene group, an isopropylene group, a propane-2,2-diyl group, a butylene group, an isobutylene group, a butylene group, and a butylene group. Among them, $C_{1-4}$ alkylene groups such as a propane-2,2-diyl group are preferable.

In Formula (7), a group of Formula (8) can be used as $T^3$. In Formula (8), each of $R^7$ and $R^8$ is a $C_{1-10}$ alkyl group, a $C_{1-4}$ fluoroalkyl group, a hydroxy group, an allyl group, an allyloxy group, an amino group, a cyano group, a nitro group, an acyl group, an acyloxy group, a carboxy group, a group having a tertiary carbon atom, a cycloalkyl group, or a combination of any of these groups; each of n7 and n8 is an integer of 0 to 4; and $T^4$ is an alkylene group, a sulfonyl group, a carbonyl group, a $C_{6-30}$ arylene group optionally having a substituent, or a combination of any of these groups. Examples of the alkyl group, the $C_{1-4}$ fluoroalkyl group, the acyl group, the acyloxy group, the group having a tertiary carbon atom, the cycloalkyl group, the alkylene group, and the arylene group are the same as respective examples described above.

Examples of the unit structure contained in a polymer used for the present invention include the unit structures of Formulae (1-1) to (1-45).

Formula (1-1)
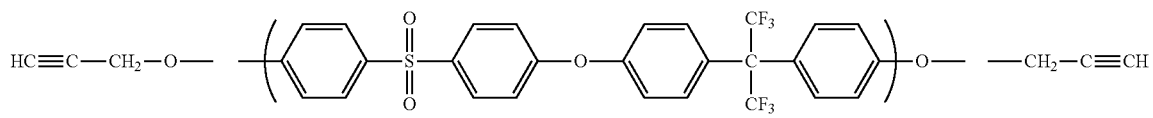

Formula (1-2)
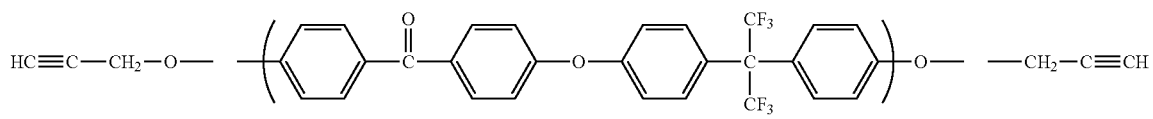

Formula (1-3)
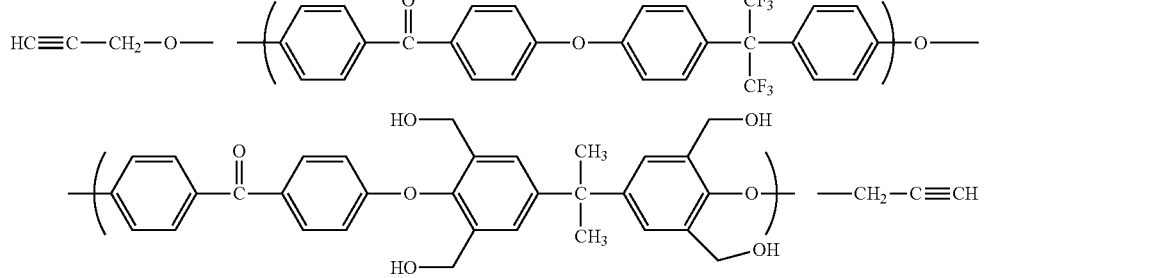

Formula (1-4)
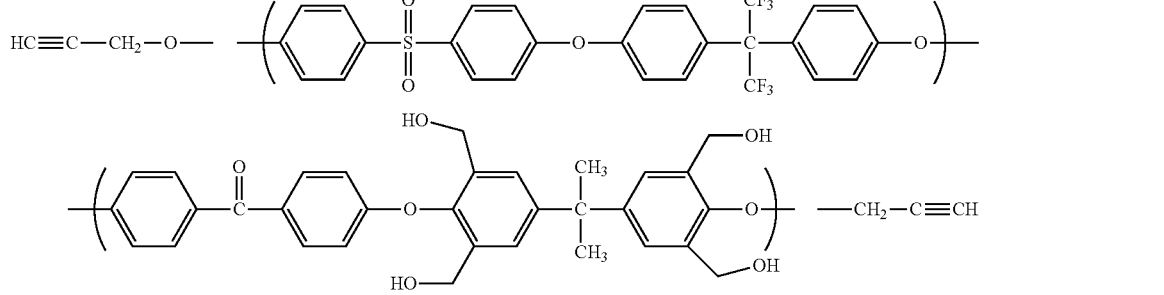

Formula (1-5)
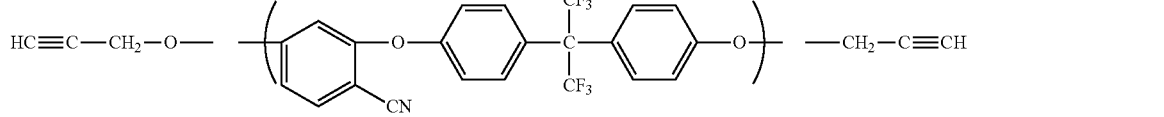

Formula (1-6)
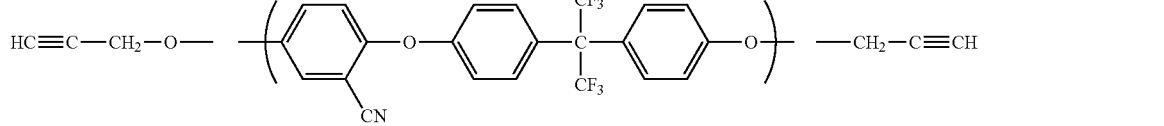

Formula (1-7)
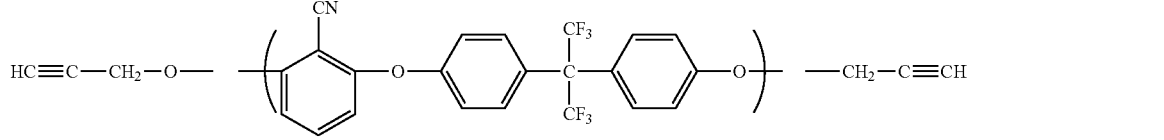

-continued
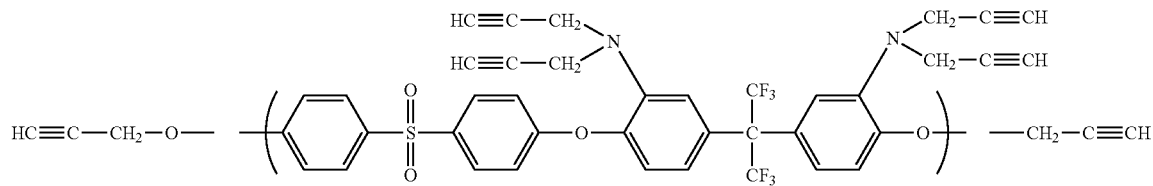
Formula (1-8)
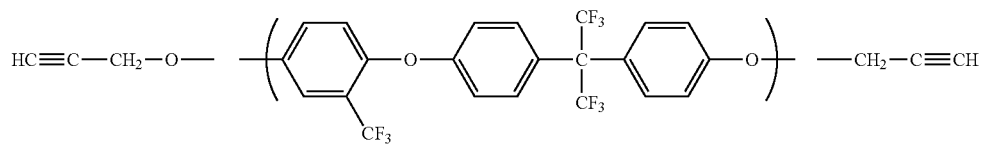
Formula (1-9)
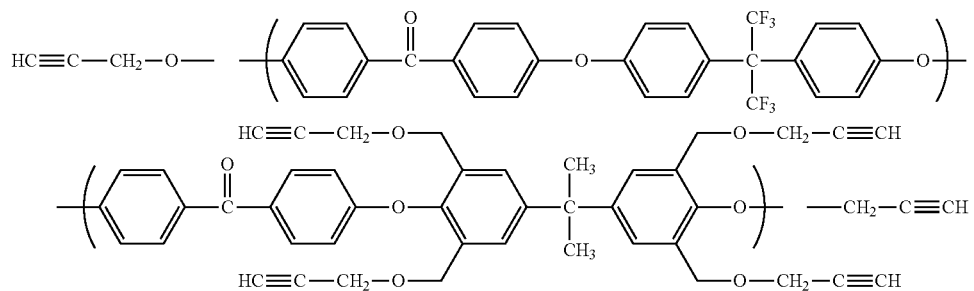
Formula (1-10)
Formula (1-11)
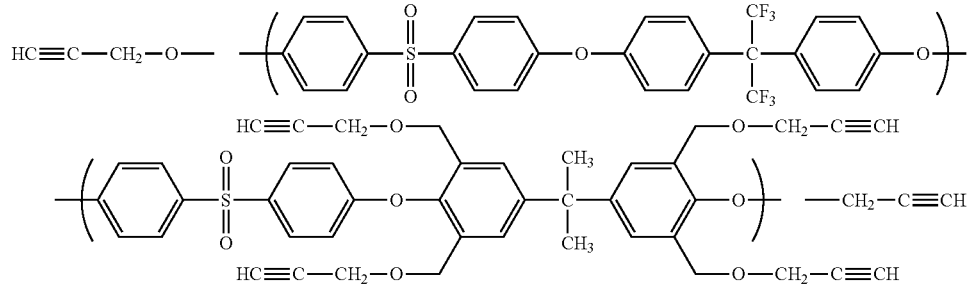
Formula (1-12)
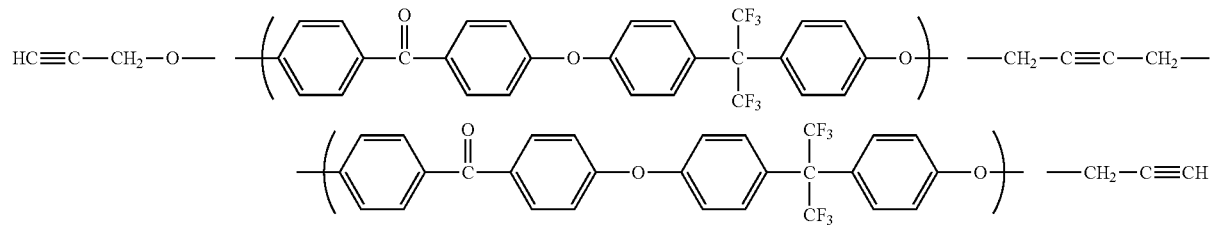
Formula (1-13)
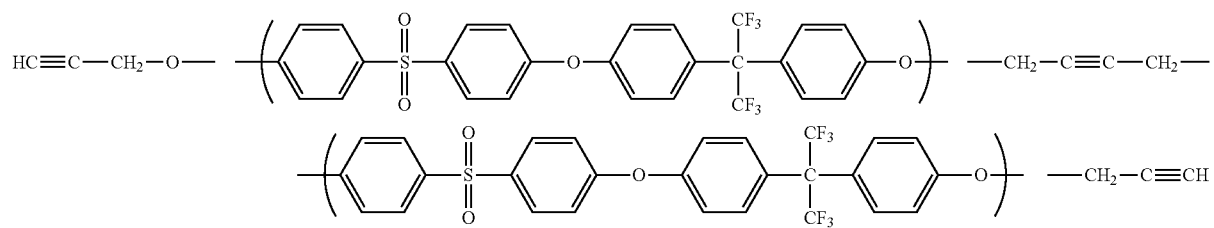
Formula (1-14)
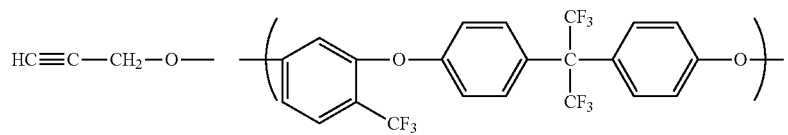

-continued
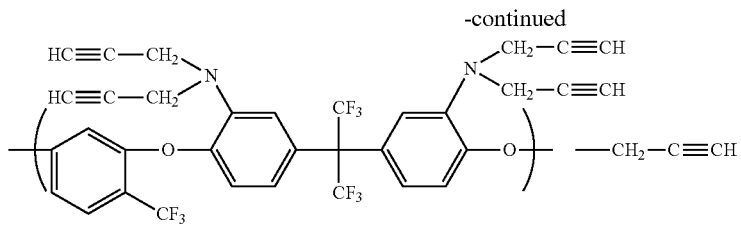
Formula (1-15)
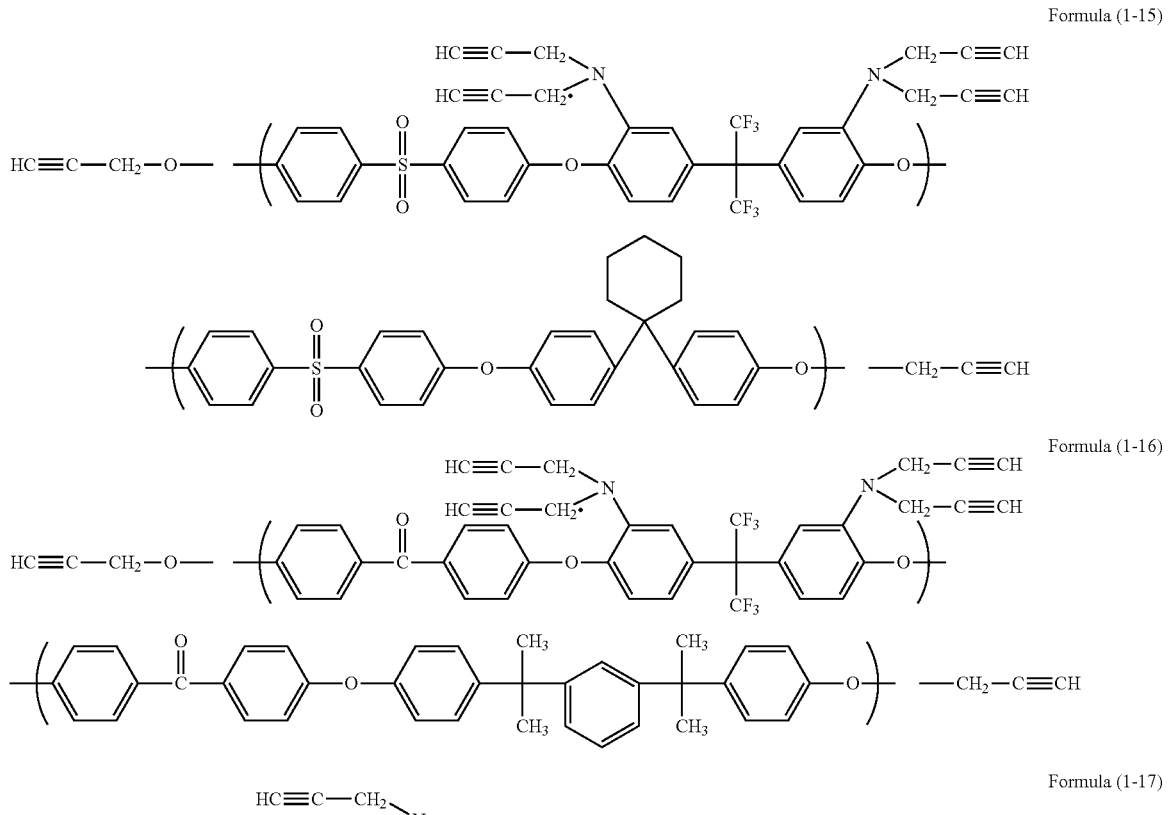
Formula (1-16)
Formula (1-17)
Formula (1-18)
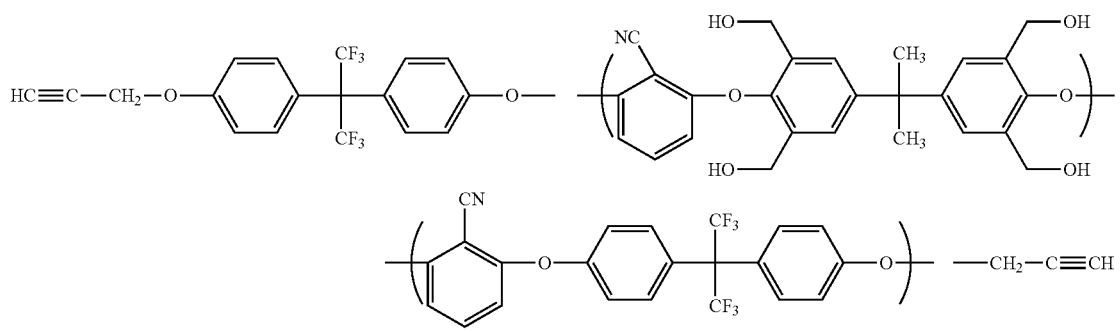

-continued
Formula (1-19)
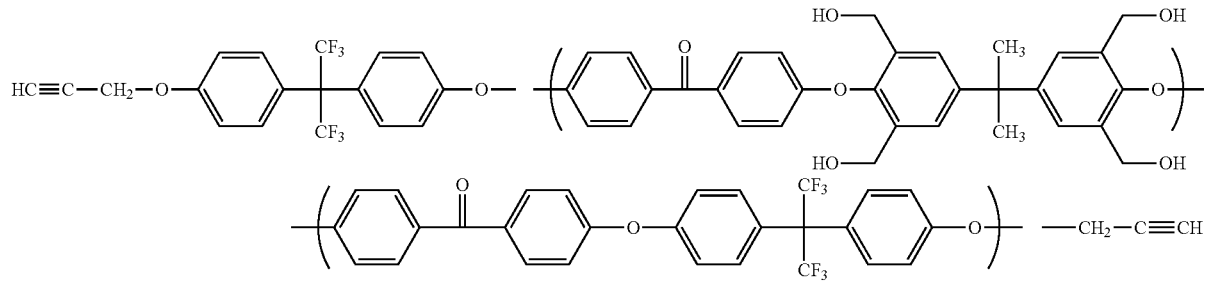
Formula (1-20)
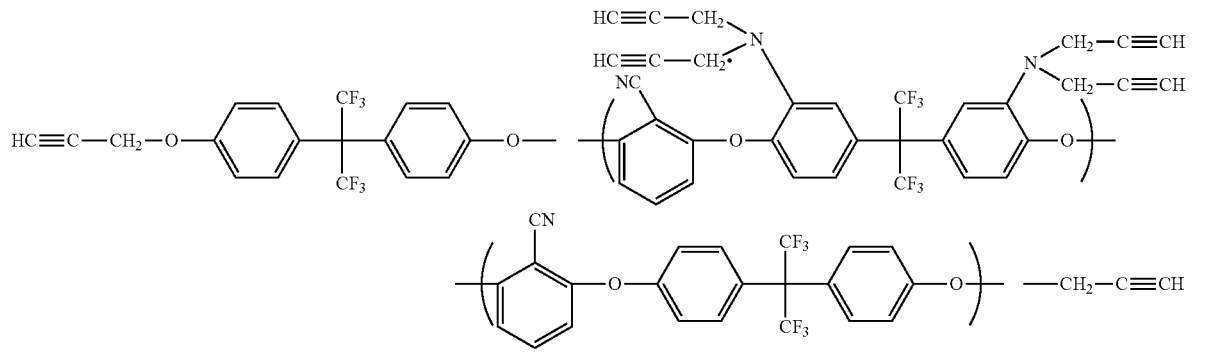
Formula (1-21)
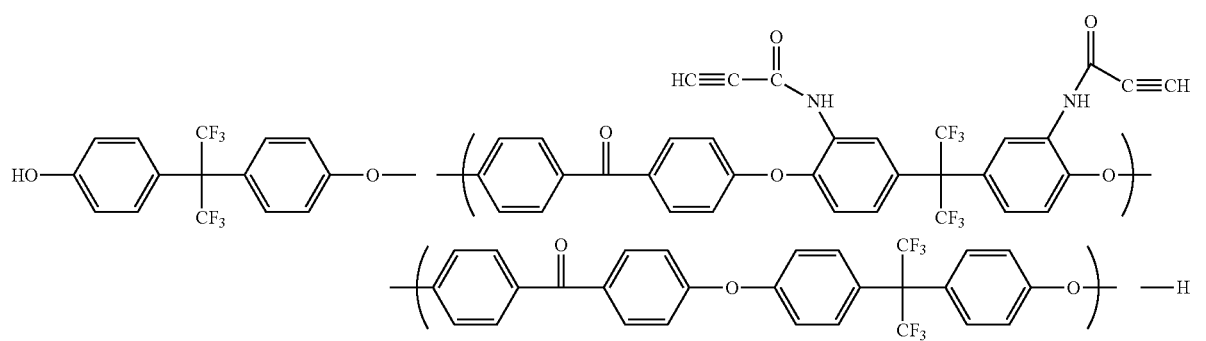
Formula (1-22)
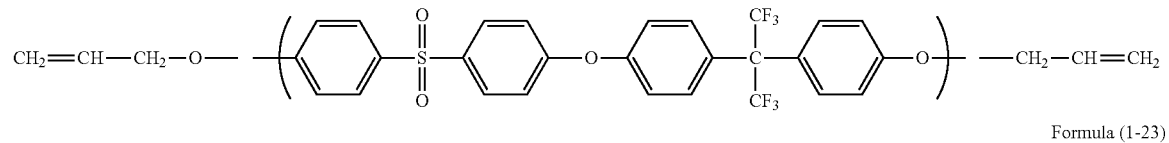
Formula (1-23)
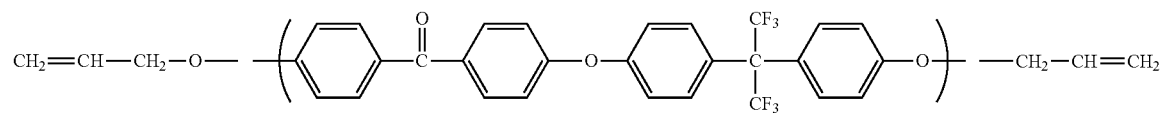
Formula (1-24)
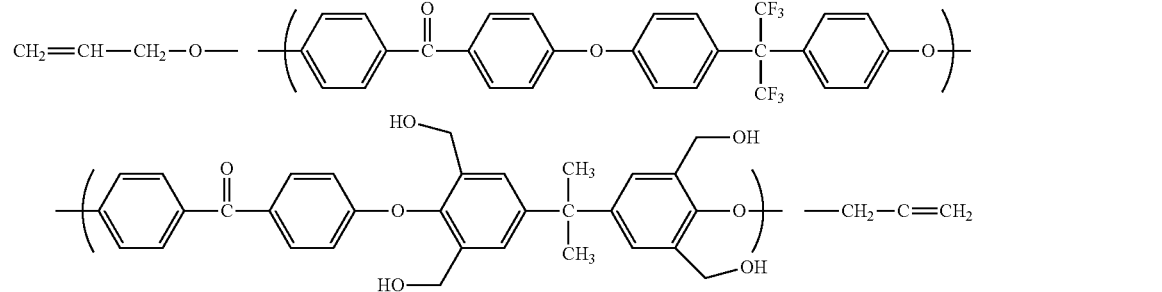

-continued
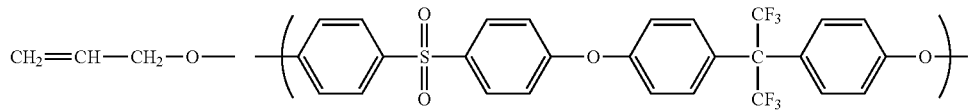
Formula (1-25)
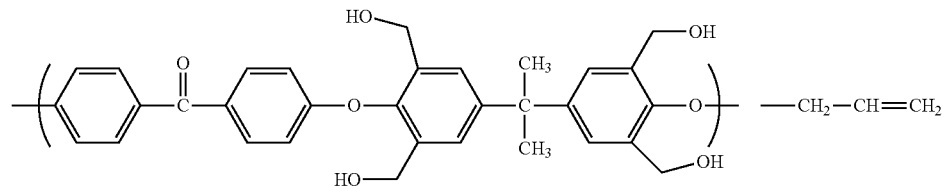
Formula (1-26)
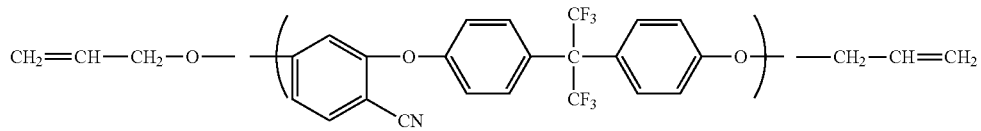
Formula (1-27)
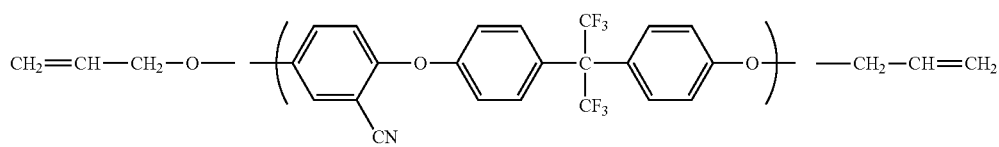
Formula (1-28)
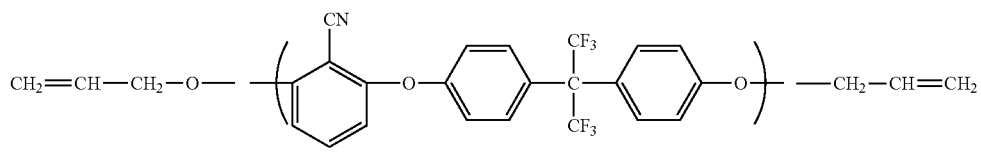
Formula (1-29)
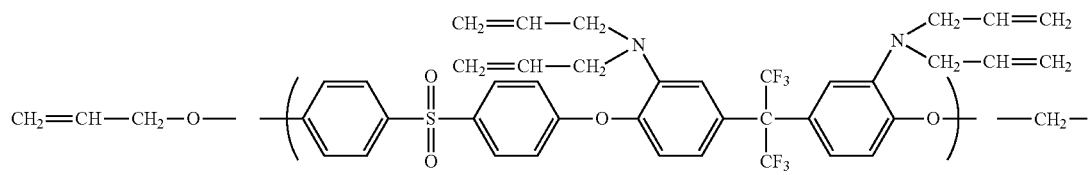
Formula (1-30)
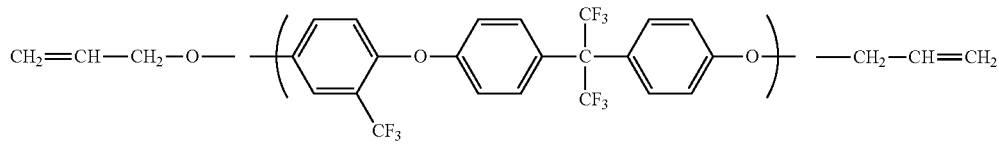
Formula (1-31)
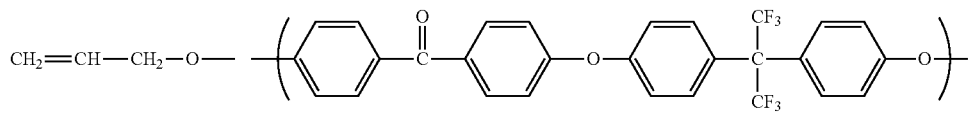
Formula (1-32)
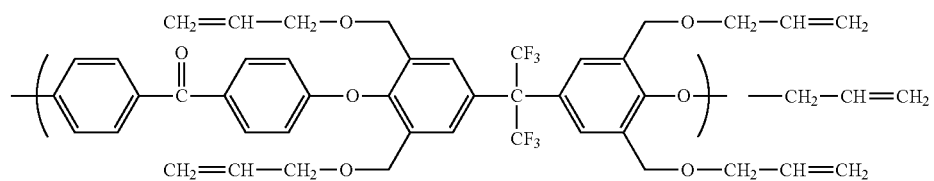
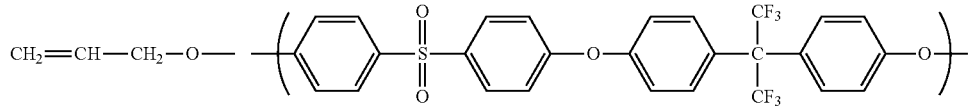

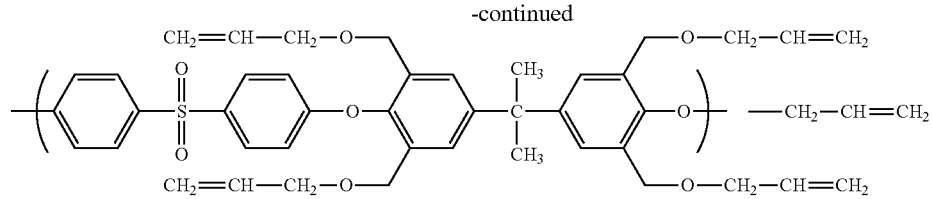
Formula (1-33)
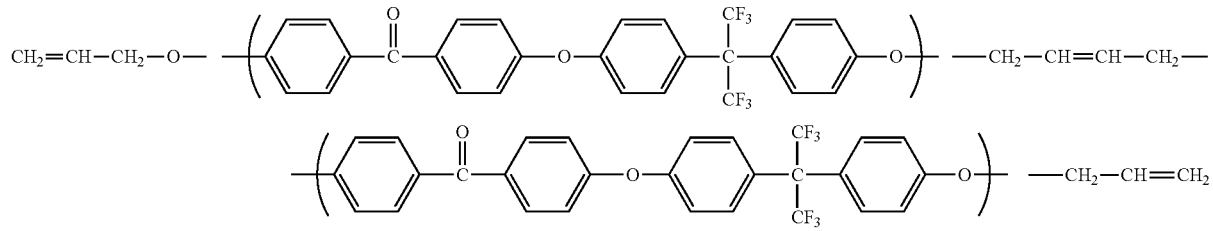
Formula (1-34)
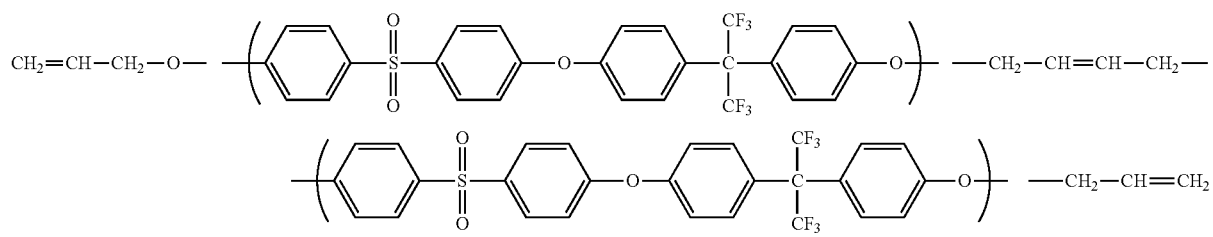
Formula (1-35)
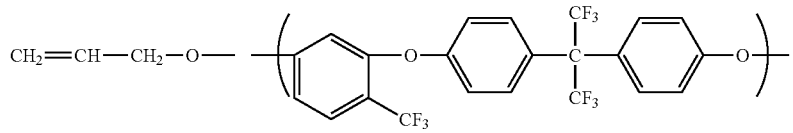
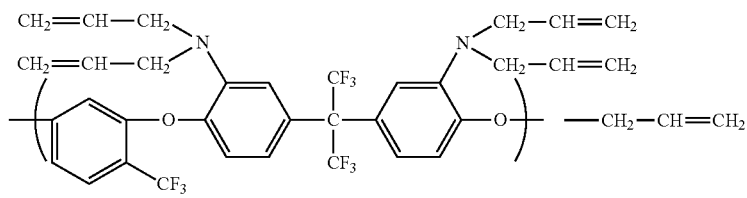
Formula (1-36)
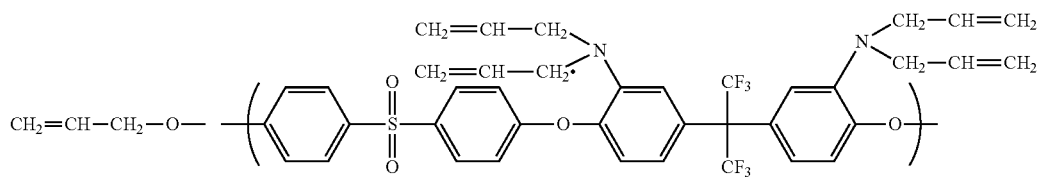
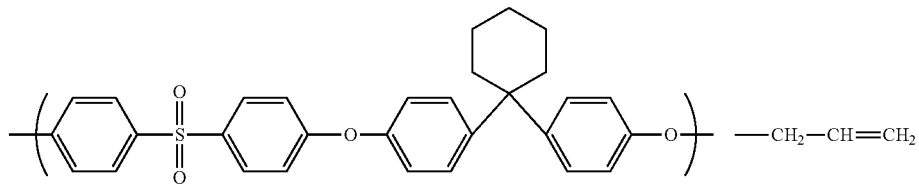
Formula (1-37)
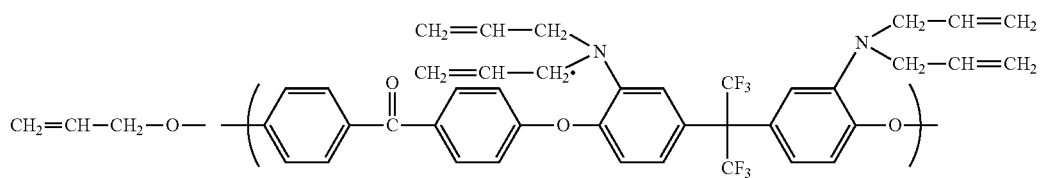

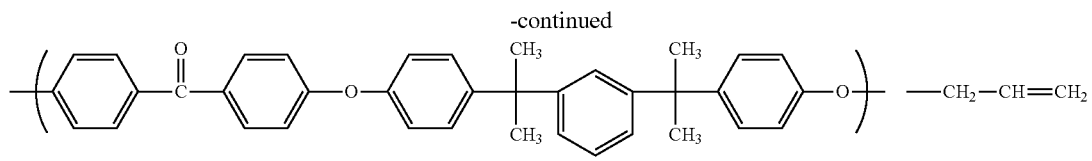
Formula (1-38)
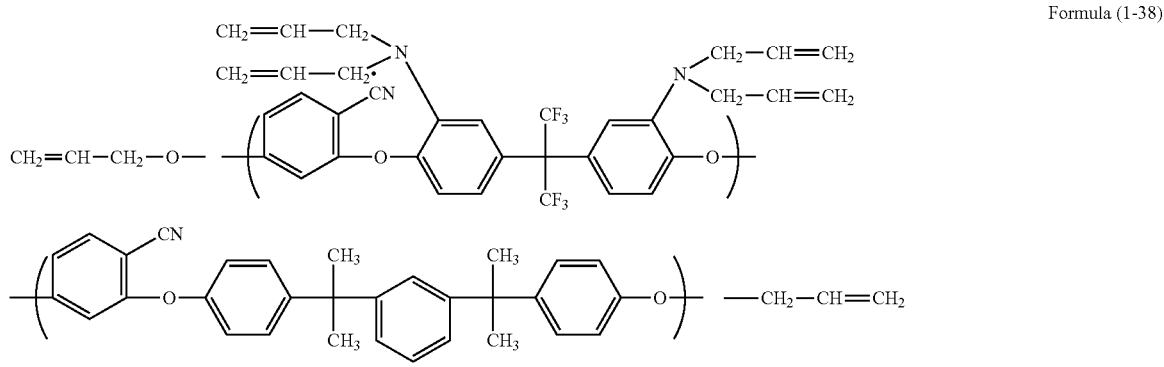
Formula (1-39)
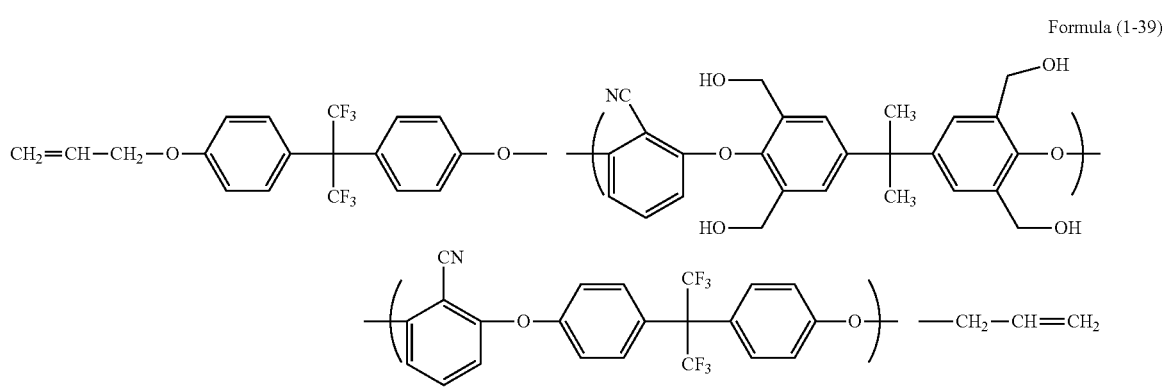
Formula (1-40)
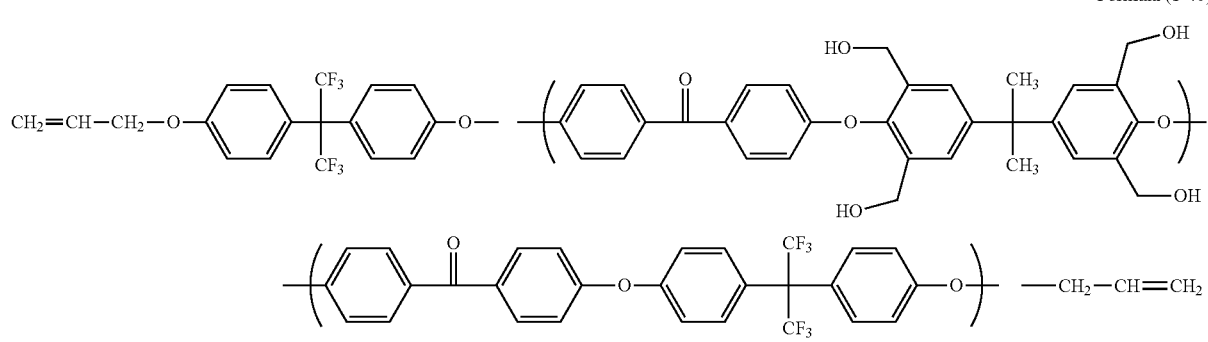
Formula (1-41)
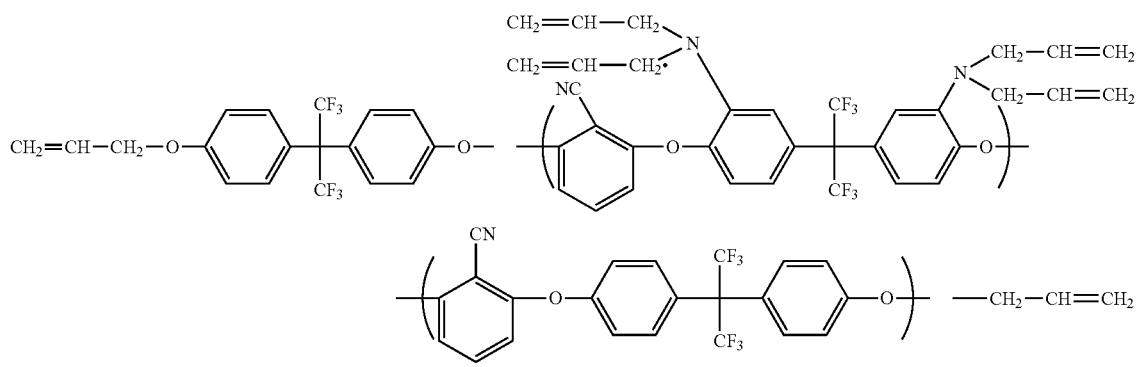

Formula (1-42)

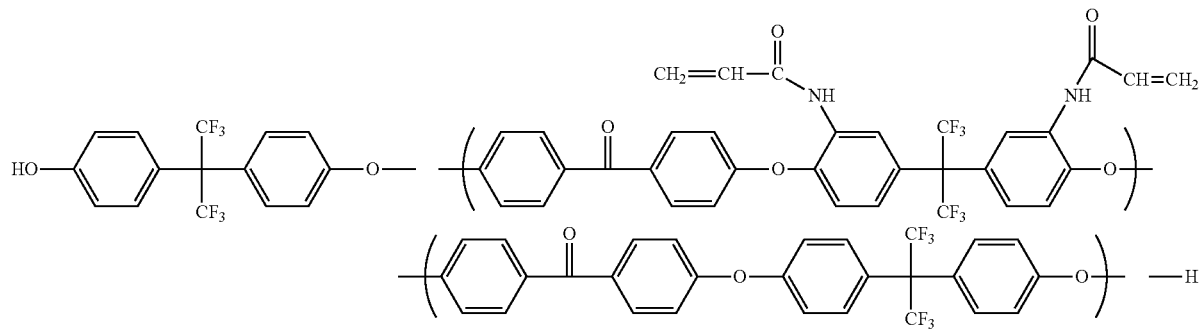

Formula (1-43)

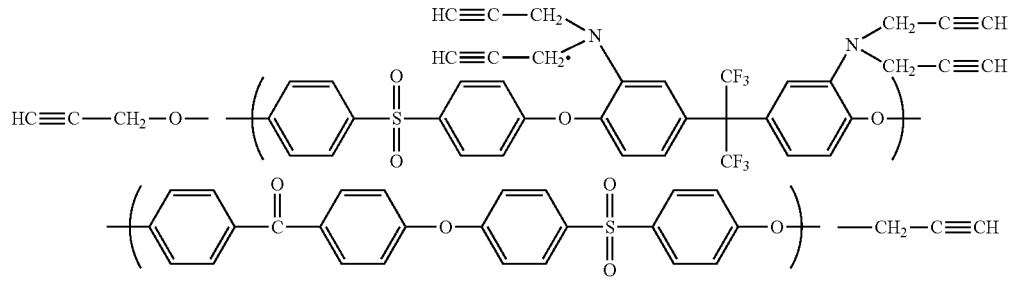

Formula (1-44)

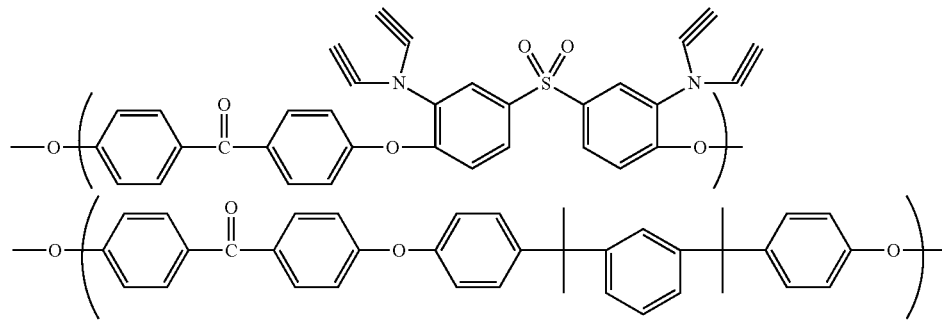

Formula (1-45)

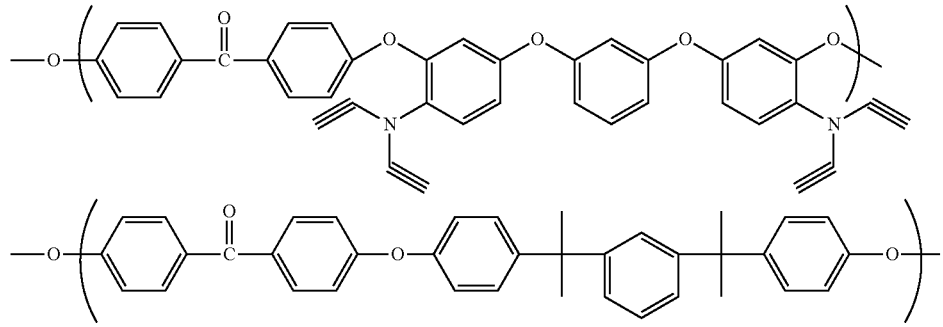

In a step for synthesizing a polymer containing a unit structure of Formula (i) or a unit structure of Formula (1), a hydroxy group can be introduced at the end, or a functional group having a hydroxy group can be introduced in the side chain.

When the hydroxy group is reacted with a monohalogenated alkyne (for example, halogen is fluorine, chlorine, bromine, and iodine) or a monohalogenated alkene (for example, halogen is fluorine, chlorine, bromine, and iodine), a carbon-carbon triple bond (alkyne) or a carbon-carbon double bond (alkene) is formed at an end or in a side chain by a dehydrohalogenation reaction.

When a polymer having a hydroxy group at the end or in the side chain thereof is reacted with a dihalogenated alkyne (for example, halogen is fluorine, chlorine, bromine, and iodine) or a dihalogenated alkene (for example, halogen is fluorine, chlorine, bromine, and iodine), a carbon-carbon triple bond (alkyne) or a carbon-carbon double bond (alkene) is formed in the main chain of the molecule by a dehydrohalogenation reaction.

Further, when an amino group is contained in a polymer (at an end or in a side chain), the above-mentioned multiple bonds are formed also by similar reactions.

A composition for forming a passivation film of the present invention can be dissolved in an organic solvent to make a coating liquid for spin-coating. Such a coating liquid can be used for spin-coating when the polymer is dissolved in the organic solvent, and the solution has a viscosity within a range from 0.001 Pa·s to 5,000 Pa·s.

The organic solvent is not particularly limited, as long as it can be used in other steps for semiconductors; organic solvents preferably used are ketones, such as cyclohexanone, methyl isoamyl ketone, and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, and dipropylene glycol, or monomethyl ether, monoethyl ether, monopropyl ether, monobutyl ether, or monophenyl ether of dipropylene glycol monoacetate; cyclic ethers, such as dioxane; and esters, such as methyl lactate, ethyl lactate, methyl acetate, ethyl acetate, butyl acetate, methyl pyruvate, ethyl pyruvate, methoxypropionic acid methyl ester, and ethoxypropionic acid ethyl ester. These can be used alone, or two or more of them can be used in combination.

Conventionally used miscible additives, such as a surfactant for improving coating performance, an additional resin, a stabilizer, and a colorant, can further be added to a composition for forming a passivation film according to the embodiments of the present invention, as long as these additives do not affect essential properties of the present invention.

Examples of the surfactant include nonionic surfactants including polyoxyethylene alkylethers, such as polyoxyethylene lauryl ether, polyoxyethylene stearyl ether, polyoxyethylene cetyl ether, and polyoxyethylene oleyl ether; polyoxyethylene alkylarylethers, such as polyoxyethylene octyl phenol ether and polyoxyethylene nonyl phenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants including Eftop (registered trademark) EF301, EF303, and EF352 (manufactured by JEMCO Co., Ltd.), MEGAFAC (registered trademark) F171, F173, and R30 (manufactured by DIC Corporation), Fluorad FC430 and FC431 (manufactured by Sumitomo 3M Limited), and AsahiGuard (registered trademark) AG710, SURFLON (registered trademark) S-382, SC101, SC102, SC103, SC104, SC105, and SC106 (manufactured by Asahi Glass Co., Ltd.); and organosiloxane polymer KP341 (manufactured by Shin-Etsu Chemical Co., Ltd.). These surfactants can be added alone, or two or more surfactants can be added in combination. The mixing amount of the surfactant is, for example, 0.01% to 10% by mass of the whole solid content.

Addition polymerization polymers or condensation polymerization polymers, such as polyesters, polystyrenes, polyimides, acrylic polymers, methacrylic polymers, polyvinyl ethers, phenol novolacs, naphthol novolacs, polyethers, polyamides, and polycarbonates can be used as the additional resin (polymer). Among them, polymers having an aromatic ring structure such as a benzene ring, a naphthalene ring, an anthracene ring, a triazine ring, a quinoline ring, and a quinoxaline ring are preferably used.

Examples of the additional resin (polymer) include an addition polymerization polymer having an addition polymerization monomer, such as benzyl acrylate, benzyl methacrylate, phenyl acrylate, naphthyl acrylate, anthryl methacrylate, anthrylmethyl methacrylate, styrene, hydroxy styrene, benzylvinyl ether, and N-phenyl maleimide, as a structural unit thereof; and a condensation polymerization polymer such as phenol novolac and naphthol novolac.

A polymer not having any aromatic ring structures can also be used as the additional resin (polymer). Examples of such a polymer include addition polymerization polymers containing only an addition polymerization monomer not having any aromatic ring structures as a structural unit thereof, such as alkyl acrylates, alkyl methacrylates, vinyl ether, alkylvinyl ethers, acrylonitrile, maleimide, N-alkyl maleimides, and maleic acid anhydride.

In the use of an addition polymerization polymer as an additional resin (polymer), the polymer may be a homopolymer or a copolymer. Addition polymerization monomers are used for manufacturing an addition polymerization polymer. Examples of the addition polymerization monomer include acrylic acid, methacrylic acid, acrylic acid ester compounds, methacrylic acid ester compounds, acrylamide compounds, methacrylamide compounds, vinyl compounds, styrene compounds, maleimide compounds, maleic acid anhydride, and acrylonitrile.

Examples of acrylic acid ester compounds include methyl acrylate, ethyl acrylate, normal hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyl triethoxysilane, and glycidyl acrylate.

Examples of methacrylic acid ester compounds include methyl methacrylate, ethyl methacrylate, normal hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyl triethoxysilane, glycidyl methacrylate, 2-phenylethyl methacrylate, hydroxyphenyl methacrylate, and bromophenyl methacrylate.

Examples of acrylamide compounds include acrylamide, N-methyl acrylamide, N-ethyl acrylamide, N-benzyl acrylamide, N-phenyl acrylamide, N,N-dimethyl acrylamide, and N-anthryl acrylamide.

Examples of methacrylamide compounds include methacrylamide, N-methyl methacrylamide, N-ethyl methacrylamide, N-benzyl methacrylamide, N-phenyl methacrylamide, N,N-dimethyl methacrylamide, and N-anthryl acrylamide.

Examples of vinyl compounds include vinylalcohol, 2-hydroxyethyl vinyl ether, methyl vinyl ether, ethyl vinyl ether, benzyl vinyl ether, vinyl acetic acid, vinyltrimethoxysilane, 2-chloroethyl vinyl ether, 2-methoxyethyl vinyl ether, vinyl naphthalene, and vinyl anthracene.

Examples of styrene compounds include styrene, hydroxystyrene, chlorostyrene, bromostyrene, methoxystyrene, cyanostyrene, and acetylstyrene.

Examples of maleimide compounds include maleimide, N-methylmaleimide, N-phenylmaleimide, N-cyclohexylmaleimide, N-benzyl maleimide, and N-hydroxyethylmaleimide.

When an additional resin (polymer) is used in a composition for forming a passivation film of the present invention, the weight-average molecular weight of the additional resin is, for example, 1,000 to 1,000,000, or 3,000 to 300,000; and for example, 5,000 to 200,000, or 10,000 to 100,000.

When an additional resin (polymer) is contained in a composition for forming a passivation film of the present invention, a content thereof is, for example, 0% to 40% by mass, or 0% to 20% by mass, or 1% to 19% by mass of a solid content.

In the present invention, the thickness of a passivation film that is prepared by spin-coating a substrate with a composition for forming a passivation film by using a device such as a spin coater, may preferably be 0.1 μm or more and 200 μm or less. When the thickness is excessively small, concavity and convexity of the surface cannot be followed, and thus a void may be formed in the film. In contrast, when the thickness is excessively large, an adhesive layer may be cracked. Accordingly, a thickness from 1 μm to 50 μm is preferable.

After the substrate is coated, baking may be conducted at a temperature within a range of about 100° C. to about 350° C., about 100° C. to about 300° C., or about 100° C. to about 250° C., for about 0.5 minute to about 180 minutes, about 0.5 minute to about 40 minutes, or about 0.5 minute to about 5 minutes.

A passivation film thus obtained is also included in the scope of the present invention.

A passivation film of the present invention can be suitably used as a film protecting an IC circuit formed on a wafer, or a film protecting an electrode formed on the rear surface of a wafer.

Hereinafter, the present invention will be explained more specifically according to the examples and the comparative examples; however, the present invention is not limited thereto.

EXAMPLES

GPC analyses of macromolecular compounds obtained in the synthesis examples described below were conducted with the following device under the following measuring conditions.

Device: All-in-one high-speed GPC system, HLC-8220GPC, manufactured by Tosoh Corporation
Column: KF-G, KF804L
Column temperature: 40° C.
Solvent: THF
Flux: 1.0 mL/minute
Standard sample: polystyrene
Detector: RI Synthesis Example 1

In a three-neck flask equipped with a stirrer, a thermometer, and a Dimroth condenser, 9.27 g of 4,4'-difluorobenzophenone, 9.16 g of 2,2-bis(3-amino-4-hydroxyphenyl)hexafluoropropane, and 8.66 g of 1,3-bis[2-(4-hydroxyphenyl)-2-propyl]benzene were dissolved in 81.27 g of 1-methyl-2-pyrrolidinone. 20.73 g of potassium carbonate was then added, the air in the system was replaced with a nitrogen gas, and the mixture was reacted in an oil bath at 160° C. for 20 hours. After the reaction was completed, the system was cooled until the temperature became 80° C., and then 50.56 g of propargyl bromide dissolved in 39.73 g of 1-methyl-2-pyrrolidinone, and 20.73 g of potassium carbonate were added. The mixture was stirred at 80° C. for 20 hours to react with a phenol group and an amino group that are at the end of a polymer.

After the reaction was completed, the reaction solution was filtrated by using a Kiriyama funnel under suction, and a solution, in which 2N-hydrochloric acid and 1-methyl-2-pyrrolidinone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-16)) showed that the weight average molecular weight of the compound was 14,700 in terms of polystyrene, and the rate of a reaction from a phenol group and an amino group existed at the end to an organic group containing a triple bond was 86%.

Synthesis Example 2

In a three-neck flask equipped with a stirrer, a thermometer, and a Dimroth condenser, 54.56 g of 4,4'-dichlorodiphenylsulfone and 67.25 g of 2,2-bis(4-hydroxyphenyl)hexafluoropropane were dissolved in 753.46 g of 1-methyl-2-pyrrolidone. 28.88 g of potassium carbonate was then added, the air in the system was replaced with a nitrogen gas, and the mixture was reacted in an oil bath at 190° C. for 20 hours.

The reaction solution was filtrated by using a Kiriyama funnel under suction, and a solution, in which 1N-hydrochloric acid and 1-methyl-2-pyrrolidone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

10 g of the obtained powder was dissolved in 100 g of tetrahydrofuran, and then 2.16 g of potassium carbonate and 1.69 g of propargyl bromide were added and reacted for 20 hours under reflux. The obtained reaction solution was filtrated by using a Kiriyama funnel under suction, and a solution, in which 1N-hydrochloric acid and 1-methyl-2-pyrrolidone were mixed with a ratio of 1:9, was added to the obtained solution until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-1)) showed that the weight average molecular weight of the compound was 19,000 in terms of polystyrene.

Synthesis Example 3

In a three-neck flask equipped with a stirrer, a thermometer, and a Dimroth condenser, 40.37 g of 4,4'-difluorobenzophenone and 69.11 g of 2,2-bis(4-hydroxyphenyl)hexafluoropropane were dissolved in 558.56 g of 1-methyl-2-pyrrolidone. 76.71 g of potassium carbonate was then added, the air in the system was replaced with a nitrogen gas, and the mixture was reacted in an oil bath at 190° C. for 20 hours.

The reaction solution was filtrated by using a Kiriyama funnel under suction, and a solution, in which 1N-hydrochloric acid and 1-methyl-2-pyrrolidone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

10 g of the obtained powder was dissolved in 100 g of tetrahydrofuran, and then 2.16 g of potassium carbonate and 1.69 g of propargyl bromide were added and reacted for 20 hours under reflux. The obtained reaction solution was filtrated by using a Kiriyama funnel under suction, and a solution, in which 1N-hydrochloric acid and 1-methyl-2-pyrrolidone were mixed with a ratio of 1:9, was added to the obtained solution until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-2)) showed that the weight average molecular weight of the compound was 15,000 in terms of polystyrene.

Synthesis Example 4

In a three-neck flask equipped with a stirrer, a thermometer, and a Dimroth condenser, 25.83 g of 4,4'-difluorobenzophenone, 50.43 g of 2,2-bis(4-hydroxyphenyl)hexafluoropropane, and 2.75 g of 2,2'-bis(4-hydroxy-3,5-dihydroxymethylphenyl)propane were dissolved in 504.22 g of 1-methyl-2-pyrrolidone. 21.82 g of potassium carbonate was then added, the air in the system was replaced with a nitrogen gas, and the mixture was reacted in an oil bath at 160° C. for 20 hours.

The reaction solution was filtrated by using a Kiriyama funnel under suction, and a solution, in which 1N-hydrochloric acid and 1-methyl-2-pyrrolidone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

10 g of the obtained powder was dissolved in 100 g of tetrahydrofuran, and then 2.16 g of potassium carbonate and 1.69 g of propargyl bromide were added and reacted for 20 hours under reflux. The obtained reaction solution was filtrated by using a Kiriyama funnel under suction, and a solution, in which 1N-hydrochloric acid and 1-methyl-2-pyrrolidone were mixed with a ratio of 1:9, was added to the obtained solution until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-3)) showed that the weight average molecular weight of the compound was 22,000 in terms of polystyrene.

Synthesis Example 5

In a three-neck flask equipped with a stirrer, a thermometer, and a Dimroth condenser, 43.07 g of 4,4'-dichlorodiphenylsulfone, 50.43 g of 2,2-bis(4-hydroxyphenyl)hexafluoropropane, and 2.75 g of 2,2'-bis(4-hydroxy-3,5-dihydroxymethylphenyl)propane were dissolved in 590.40 g of 1-methyl-2-pyrrolidone. 21.82 g of potassium carbonate was then added, the air in the system was replaced with a nitrogen gas, and the mixture was reacted in an oil bath at 160° C. for 20 hours.

The reaction solution was filtrated by using a Kiriyama funnel under suction, and a solution, in which 1N-hydrochloric acid and 1-methyl-2-pyrrolidone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

10 g of the obtained powder was dissolved in 100 g of tetrahydrofuran, and then 2.16 g of potassium carbonate and 1.69 g of propargyl bromide were added and reacted for 20 hours under reflux. The obtained reaction solution was filtrated by using a Kiriyama funnel under suction, and a solution, in which 1N-hydrochloric acid and 1-methyl-2-pyrrolidone were mixed with a ratio of 1:9, was added to the obtained solution until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-4)) showed that the weight average molecular weight of the compound was 26,000 in terms of polystyrene.

Synthesis Example 6

In a three-neck flask equipped with a stirrer, a thermometer, and a Dimroth condenser, 10.43 g of 2,4-fluorobenzonitrile and 26.54 g of 2,2-bis(4-hydroxyphenyl)hexafluoropropane were dissolved in 204.22 g of 1-methyl-2-pyrrolidone. 31.10 g of potassium carbonate was then added, the air in the system was replaced with a nitrogen gas, and the mixture was reacted in an oil bath at 190° C. for 20 hours.

The reaction solution was filtrated by using a Kiriyama funnel under suction, and a solution, in which 1N-hydrochloric acid and 1-methyl-2-pyrrolidone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

10 g of the obtained powder was dissolved in 100 g of tetrahydrofuran, and then 2.16 g of potassium carbonate and 1.69 g of propargyl bromide were added and reacted for 20 hours under reflux. The obtained reaction solution was filtrated by using a Kiriyama funnel under suction, and a solution, in which 1N-hydrochloric acid and 1-methyl-2-pyrrolidone were mixed with a ratio of 1:9, was added to the obtained solution until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-5)) showed that the weight average molecular weight of the compound was 7,000 in terms of polystyrene.

Synthesis Example 7

In a three-neck flask equipped with a stirrer, a thermometer, and a Dimroth condenser, 10.76 g of 2,5-fluorobenzonitrile and 26.54 g of 2,2-bis(4-hydroxyphenyl)hexafluoropropane were dissolved in 204.22 g of 1-methyl-2-pyrrolidone. 31.10 g of potassium carbonate was then added, the air in the system was replaced with a nitrogen gas, and the mixture was reacted in an oil bath at 190° C. for 20 hours.

The reaction solution was filtrated by using a Kiriyama funnel under suction, and a solution, in which 1N-hydrochloric acid and 1-methyl-2-pyrrolidone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

10 g of the obtained powder was dissolved in 100 g of tetrahydrofuran, and then 2.16 g of potassium carbonate and 1.69 g of propargyl bromide were added and reacted for 20 hours under reflux. The obtained reaction solution was filtrated by using a Kiriyama funnel under suction, and a solution, in which 1N-hydrochloric acid and 1-methyl-2-pyrrolidone were mixed with a ratio of 1:9, was added to the obtained solution until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-6)) showed that the weight average molecular weight of the compound was 12,000 in terms of polystyrene.

Synthesis Example 8

In a three-neck flask equipped with a stirrer, a thermometer, and a Dimroth condenser, 10.76 g of 2,6-fluorobenzonitrile and 26.54 g of 2,2-bis(4-hydroxyphenyl)hexafluoropropane were dissolved in 204.22 g of 1-methyl-2-pyrrolidone. 31.10 g of potassium carbonate was then added, the air in the system was replaced with a nitrogen gas, and the mixture was reacted in an oil bath at 190° C. for 20 hours.

The reaction solution was filtrated by using a Kiriyama funnel under suction, and a solution, in which 1N-hydrochloric acid and 1-methyl-2-pyrrolidone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

10 g of the obtained powder was dissolved in 100 g of tetrahydrofuran, and then 2.16 g of potassium carbonate and 1.69 g of propargyl bromide were added and reacted for 20 hours under reflux. The obtained reaction solution was filtrated by using a Kiriyama funnel under suction, and a solution, in which 1N-hydrochloric acid and 1-methyl-2-pyrrolidone were mixed with a ratio of 1:9, was added to the obtained solution until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-7))

showed that the weight average molecular weight of the compound was 11,000 in terms of polystyrene.

Synthesis Example 9

In a three-neck flask equipped with a stirrer, a thermometer, and a Dimroth condenser, 25.84 g of 4,4'-dichlorodiphenylsulfone and 26.54 g of 2,2-bis(3-amino-4-hydroxyphenyl)hexafluoropropane were dissolved in 204.22 g of 1-methyl-2-pyrrolidone. 31.10 g of potassium carbonate was then added, the air in the system was replaced with a nitrogen gas, and the mixture was reacted in an oil bath at 190° C. for 20 hours. After the reaction was completed, the system was cooled until the temperature became 80° C., and then 12.44 g of potassium carbonate and 22.54 g of propargyl bromide were added, and reacted at 80° C. for 20 hours.

After the reaction was completed, the reaction solution was filtrated by using a Kiriyama funnel under suction, and a solution, in which 1N-hydrochloric acid and 1-methyl-2-pyrrolidone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-8)) showed that the weight average molecular weight of the compound was 40,000 in terms of polystyrene.

Synthesis Example 10

In a three-neck flask equipped with a stirrer, a thermometer, and a Dimroth condenser, 10.21 g of 2,4'-dichlorobenzotrifluoride, 9.16 g of 2,2-bis(3-amino-4-hydroxyphenyl)hexafluoropropane, and 8.41 g of 2,2-bis(4-hydroxyphenyl)hexafluoropropane were dissolved in 204.22 g of 1-methyl-2-pyrrolidone. 20.73 g of potassium carbonate was then added, the air in the system was replaced with a nitrogen gas, and the mixture was reacted in an oil bath at 190° C. for 20 hours. After the reaction was completed, the system was cooled until the temperature became 80° C., and then 14.14 g of propargyl bromide was added, and reacted at 80° C. for 20 hours.

After the reaction was completed, the reaction solution was filtrated by using a Kiriyama funnel under suction, and a solution, in which 1N-hydrochloric acid and 1-methyl-2-pyrrolidinone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-14)) showed that the weight average molecular weight of the compound was 40,000 in terms of polystyrene.

Synthesis Example 11

In a three-neck flask equipped with a stirrer, a thermometer, and a Dimroth condenser, 10.81 g of bis(4-fluorophenyl)sulfone, 9.16 g of 2,2-bis(3-amino-4-hydroxyphenyl)hexafluoropropane, and 6.71 g of 1,1-bis(4-hydroxyphenyl)cyclohexane were dissolved in 80.01 g of 1-methyl-2-pyrrolidinone. 20.73 g of potassium carbonate was then added, the air in the system was replaced with a nitrogen gas, and the mixture was reacted in an oil bath at 160° C. for 20 hours, After the reaction was completed, the system was cooled until the temperature became 80° C., and then 66.54 g of allyl bromide dissolved in 43.31 g of 1-methyl-2-pyrrolidinone, and 20.73 g of potassium carbonate were added. The mixture was stirred at 80° C. for 20 hours to react with a phenol group and an amino group that are at the end of a polymer.

After the reaction was completed, the reaction solution was filtrated by using a Kiriyama funnel under suction, and a solution, in which 2N-hydrochloric acid and 1-methyl-2-pyrrolidinone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-36)) showed that the weight average molecular weight of the compound was 13,400 in terms of polystyrene, and a reaction rate of a phenol group and an amino group existed at the end was 88%.

Synthesis Example 12

In a three-neck flask equipped with a stirrer, a thermometer, and a Dimroth condenser, 37.09 g of 4,4'-difluorobenzophenone, 36.63 g of 2,2-bis(3-amino-4-hydroxyphenyl)hexafluoropropane, and 34.65 g of 1,3-bis[2-(4-hydroxyphenyl)-2-propyl]benzene were dissolved in 325.10 g of 1-methyl-2-pyrrolidinone. 82.93 g of potassium carbonate was then added, the air in the system was replaced with a nitrogen gas, and the mixture was reacted in an oil bath at 160° C. for 20 hours. After the reaction was completed, the system was cooled until the temperature became 80° C., and then 193.57 g of allyl bromide dissolved in 156.76 g of 1-methyl-2-pyrrolidinone, and 138.21 g of potassium carbonate were added. The mixture was stirred at 80° C. for 20 hours to react with a phenol group and an amino group that are at the end of a polymer.

After the reaction was completed, the reaction solution was filtrated by using a Kiriyama funnel under suction, and a solution, in which 2N-hydrochloric acid and 1-methyl-2-pyrrolidinone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-37)) showed that the weight average molecular weight of the compound was 13,900 in terms of polystyrene, and a reaction rate of a phenol group and an amino group existed at the end was 88%.

Synthesis Example 13

In a three-neck flask equipped with a stirrer, a thermometer, and a Dimroth condenser, 9.27 g of 4,4'-difluorobenzophenone, 9.16 g of 2,2-bis(3-amino-4-hydroxyphenyl)hexafluoropropane, and 8.66 g of 1,3-bis[2-(4-hydroxyphenyl)-2-propyl]benzene were dissolved in 81.27 g of 1-methyl-2-pyrrolidinone. 20.73 g of potassium carbonate was then added, the air in the system was replaced with a nitrogen gas, and the mixture was reacted in an oil bath at 160° C. for 20 hours. After the reaction was completed, the system was cooled until the temperature became 80° C., and then 12.64 g of propargyl bromide dissolved in 39.73 g of 1-methyl-2-pyrrolidinone, and 20.73 g of potassium carbonate were added. The mixture was stirred at 80° C. for 20 hours to react with a phenol group and an amino group that are at the end of a polymer.

After the reaction was completed, the reaction solution was filtrated by using a Kiriyama funnel under suction, and a solution, in which 2N-hydrochloric acid and 1-methyl-2-pyrrolidinone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-16)) showed that the weight average molecular weight of the compound was 14,700 in terms of polystyrene, and a reaction rate of a phenol group and an amino group existed at the end was 52%.

Synthesis Example 14

In a three-neck flask equipped with a stirrer, a thermometer, and a Dimroth condenser, 6.61 g of 2,4-difluorobenzonitrile, 9.16 g of 2,2-bis(3-amino-4-hydroxyphenyl)hexafluoropropane, and 8.66 g of 1,3-bis[2-(4-hydroxyphenyl)-2-propyl]benzene were dissolved in 73.28 g of 1-methyl-2-pyrrolidinone. 20.73 g of potassium carbonate was then added, the air in the system was replaced with a nitrogen gas, and the mixture was reacted in an oil bath at 160° C. for 20 hours. After the reaction was completed, the system was cooled until the temperature became 80° C., and then 14.13 g of propargyl bromide dissolved in 27.96 g of 1-methyl-2-pyrrolidinone was added. The mixture was stirred at 80° C. for 20 hours to react with a phenol group and an amino group that are at the end of a polymer.

After the reaction was completed, the reaction solution was filtrated by using a Kiriyama funnel under suction, and a solution, in which 2N-hydrochloric acid and 1-methyl-2-pyrrolidinone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-17)) showed that the weight average molecular weight of the compound was 12,700 in terms of polystyrene, and a reaction rate of a phenol group and an amino group existed at the end was 50%.

Synthesis Example 15

In a three-neck flask equipped with a stirrer, a thermometer, and a Dimroth condenser, 20.86 g of 2,6-difluorobenzonitrile, 54.91 g of 2,2-bis(4-hydroxyphenyl)hexafluoropropane, and 1.16 g of 2,2'-bis(4-hydroxy-3,5-dihydroxymethylphenyl)propane were dissolved in 489.50 g of 1-methyl-2-pyrrolidone. 20.93 g of potassium carbonate was then added, the air in the system was replaced with a nitrogen gas, and the mixture was reacted in an oil bath at 160° C. for 20 hours.

The reaction solution was filtrated by using a Kiriyama funnel under suction, and a solution, in which 1N-hydrochloric acid and 1-methyl-2-pyrrolidone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

10 g of the obtained powder was dissolved in 100 g of tetrahydrofuran, and then 2.16 g of potassium carbonate and 1.69 g of propargyl bromide were added and reacted for 20 hours under reflux. The obtained reaction solution was filtrated by using a Kiriyama funnel under suction, and a solution, in which 1N-hydrochloric acid and 1-methyl-2-pyrrolidone were mixed with a ratio of 1:9, was added to the obtained solution until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-18)) showed that the weight average molecular weight of the compound was 18,000 in terms of polystyrene.

Synthesis Example 16

In a three-neck flask equipped with a stirrer, a thermometer, and a Dimroth condenser, 29.05 g of 4,4'-difluorobenzophenone, 50.43 g of 2,2-bis(4-hydroxyphenyl)hexafluoropropane, and 1.06 g of 2,2'-bis(4-hydroxy-3,5-dihydroxymethylphenyl)propane were dissolved in 519.13 g of 1-methyl-2-pyrrolidone. 21.82 g of potassium carbonate was then added, the air in the system was replaced with a nitrogen gas, and the mixture was reacted in an oil bath at 160° C. for 20 hours.

The reaction solution was filtrated by using a Kiriyama funnel under suction, and a solution, in which 1N-hydrochloric acid and 1-methyl-2-pyrrolidone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

10 g of the obtained powder was dissolved in 100 g of tetrahydrofuran, and then 2.16 g of potassium carbonate and 1.97 g of allyl bromide were added and reacted for 20 hours under reflux. The obtained reaction solution was filtrated by using a Kiriyama funnel under suction, and a solution, in which 1N-hydrochloric acid and 1-methyl-2-pyrrolidone were mixed with a ratio of 1:9, was added to the obtained solution until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-40)) showed that the weight average molecular weight of the compound was 27,000 in terms of polystyrene.

Synthesis Example 17

In a three-neck flask equipped with a stirrer, a thermometer, and a Dimroth condenser, 20.44 g of 2,6-difluorobenzonitrile, 50.44 g of 2,2-bis(4-hydroxyphenyl)hexafluoropropane, and 1.12 g of 2,2-bis(3-amino-4-hydroxyphenyl) hexafluoropropane were dissolved in 528.50 g of 1-methyl-2-pyrrolidone. 63.43 g of potassium carbonate was then added, the air in the system was replaced with a nitrogen gas, and the mixture was reacted in an oil bath at 160° C. for 20 hours.

After the reaction was completed, the system was cooled until the temperature became 80° C., and then 17.84 g of propargyl bromide dissolved in 53.53 g of 1-methyl-2-pyrrolidinone, 6.02 g of potassium iodide, and 22.80 g of potassium carbonate were added. The mixture was stirred at 80° C. for 20 hours to react with a phenol group and an amino group that are at the end of a polymer.

The reaction solution was filtrated by using a Kiriyama funnel under suction, and a solution, in which 1N-hydrochloric acid and 1-methyl-2-pyrrolidone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-20)) showed that the weight average molecular weight of the compound was 23,000 in terms of polystyrene.

Synthesis Example 18

In a three-neck flask equipped with a stirrer, a thermometer, and a Dimroth condenser, 20.67 g of 4,4'-difluorobenzophenone, 33.62 g of 2,2-bis(4-hydroxyphenyl)hexafluoropropane, and 1.92 g of 2,2-bis(3-amino-4-hydroxyphenyl) hexafluoropropane were dissolved in 361.12 g of 1-methyl-2-pyrrolidone. 20.67 g of potassium carbonate was then added, the air in the system was replaced with a nitrogen gas, and the mixture was reacted in an oil bath at 160° C. for 20 hours.

The reaction solution was filtrated by using a Kiriyama funnel under suction, and a solution, in which 1N-hydrochloric acid and 1-methyl-2-pyrrolidone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

10 g of the obtained powder was dissolved in 100 g of tetrahydrofuran, and then 0.45 g of triethylamine was added. The mixture was cooled to a temperature of 0° C., and 0.36 g of acrylic acid chloride dissolved in 10 g of tetrahydrofuran was dropped thereto over 10 minutes. After that, the mixture was left to let the temperature increase, and reacted for 20 hours. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-42)) showed that the weight average molecular weight of the compound was ND in terms of polystyrene.

Synthesis Example 19

In a three-neck flask equipped with a stirrer, a thermometer, and a Dimroth condenser, 74.19 g of 4,4'-difluorobenzophenone, 73.25 g of 2,2-bis(3-amino-4-hydroxyphenyl) hexafluoropropane, and 50.05 g of 4,4'-dihydroxydiphenylsulfone were dissolved in 592.48 g of 1-methyl-2-pyrrolidinone. 165.85 g of potassium carbonate was then added, the air in the system was replaced with a nitrogen gas, and the mixture was reacted in an oil bath at 160° C. for 20 hours. After the reaction was completed, the system was cooled until the temperature became 80° C., and then 104.68 g of propargyl bromide dissolved in 223.67 g of 1-methyl-2-pyrrolidinone, and 165.85 g of potassium carbonate were added. The mixture was stirred at 80° C. for 20 hours to react with a phenol group and an amino group that are at the end of a polymer.

After the reaction was completed, the reaction solution was filtrated by using a Kiriyama funnel under suction, and a solution, in which 2N-hydrochloric acid and 1-methyl-2-pyrrolidinone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-43)) showed that the weight average molecular weight of the compound was 16,000 in terms of polystyrene, and the rate of a reaction from a phenol group and an amino group existed at the end to an organic group containing a triple bond was 79%.

Synthesis Example 20

In a three-neck flask equipped with a stirrer, a thermometer, and a Dimroth condenser, 18.55 g of 4,4'-difluorobenzophenone, 14.02 g of 3,3'-diamino-4,4'-dihydroxydiphenylsulfone, and 17.32 g of 1,3-bis[2-(4-hydroxyphenyl)-2-propyl]benzene were dissolved in 149.67 g of 1-methyl-2-pyrrolidinone. 41.46 g of potassium carbonate was then added, the air in the system was replaced with a nitrogen gas, and the mixture was reacted in an oil bath at 160° C. for 20 hours. After the reaction was completed, the system was cooled until the temperature became 80° C., and then 26.17 g of propargyl bromide dissolved in 56.43 g of 1-methyl-2-pyrrolidinone, and 41.46 g of potassium carbonate were added. The mixture was stirred at 80° C. for 20 hours to react with a phenol group and an amino group that are at the end of a polymer.

After the reaction was completed, the reaction solution was filtrated by using a Kiriyama funnel under suction, and a solution, in which 2N-hydrochloric acid and 1-methyl-2-pyrrolidinone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-44)) showed that the weight average molecular weight of the compound was 6,600 in terms of polystyrene, and the rate of a reaction from a phenol group and an amino group existed at the end to an organic group containing a triple bond was 52%.

Synthesis Example 21

In a three-neck flask equipped with a stirrer, a thermometer, and a Dimroth condenser, 18.55 g of 4,4'-difluorobenzophenone, 16.22 g of 1,3-bis(4-amino-3-hydroxyphenoxy) benzene, and 17.32 g of 1,3-bis[2-(4-hydroxyphenyl)-2-propyl]benzene were dissolved in 149.67 g of 1-methyl-2-pyrrolidinone. 41.46 g of potassium carbonate was then added, the air in the system was replaced with a nitrogen gas, and the mixture was reacted in an oil bath at 160° C. for 20 hours. After the reaction was completed, the system was cooled until the temperature became 80° C., and then 26.17 g of propargyl bromide dissolved in 56.43 g of 1-methyl-2-pyrrolidinone, and 41.46 g of potassium carbonate were added. The mixture was stirred at 80° C. for 20 hours to react with a phenol group and an amino group that are at the end of a polymer.

After the reaction was completed, the reaction solution was filtrated by using a Kiriyama funnel under suction, and a solution, in which 2N-hydrochloric acid and 1-methyl-2-pyrrolidinone were mixed with a ratio of 1:9, was added to the filtrate until it became acidic. A litmus paper was used to confirm acidity of the solution. The obtained solution was dropped into a mixed solution, in which water and methanol were mixed with a ratio of 1:9, and was reprecipitated. After the dropping was completed, the mixture was filtrated by using a Buchner funnel under suction, and then washed for three times with methanol, for two times with water, and finally for three times with methanol. The obtained powder was dried in a vacuum dryer for 12 hours.

A GPC analysis of the obtained macromolecular compound (corresponding to a compound of Formula (1-45)) showed that the weight average molecular weight of the compound was 28,000 in terms of polystyrene, and the rate of a reaction from a phenol group and an amino group existed at the end to an organic group containing a triple bond was 84%.

Preparation of Composition for Forming Passivation Film

Example 1

50 g of a macromolecular compound obtained in Synthesis Example 1 was dissolved in 93 g of cyclohexanone, and then filtered through a polyethylene microfilter having a pore size of 1.0 μm to prepare a composition for forming a passivation film having a solid content of 35% by mass.

Example 2

50 g of a macromolecular compound obtained in Synthesis Example 19 was dissolved in 93 g of cyclohexanone, and then filtered through a polyethylene microfilter having a pore size of 1.0 μm to prepare a composition for forming a passivation film having a solid content of 35% by mass.

Example 3

50 g of a macromolecular compound obtained in Synthesis Example 20 was dissolved in 93 g of cyclohexanone, and then filtered through a polyethylene microfilter having a pore size of 1.0 μm to prepare a composition for forming a passivation film having a solid content of 35% by mass.

Example 4

50 g of a macromolecular compound obtained in Synthesis Example 21 was dissolved in 93 g of cyclohexanone, and then filtered through a polyethylene microfilter having a pore size of 1.0 μm to prepare a composition for forming a passivation film having a solid content of 35% by mass.

Comparative Example 1

The CYCLOTENE 3022-35 (manufactured by the Dow Chemical Company), which is a benzocyclobutene resin solution, was prepared as a composition for forming a passivation film.

Comparative Example 2

50 g of a poly(pyromellitic dianhydride-co-4,4'-oxydianiline) amic acid solution (Pyre-ML RC-5019, a 1-methyl-2-pyrrolidone solution having a solid content of 16% by mass, Sigma-Aldrich Japan K.K.), which is a polyimide precursor, was prepared as a composition for forming a passivation film.

Comparative Example 3

50 g of polysulfone (Sigma-Aldrich Japan K.K.) was dissolved in 200 g of 1-methyl-2-pyrrolidone, and then filtered through a polyethylene microfilter having a pore size of 1.0 μm. A polysulfone solution having a solid content of 25% by mass, which is an aromatic polyether, was prepared as a composition for forming a passivation film.

<Evaluation of Passivation Film>

Each of passivation films produced with compositions for forming passivation films obtained in Examples 1 to 4 and Comparative Examples 1 to 3 was evaluated for solvent-tolerance, heat-tolerance, adhesive force, dry etching, and electrical properties.

<Solvent-Tolerance>

Each of compositions for forming passivation films obtained in Examples 1 to 4 and Comparative Examples 1 to 3 was applied onto a silicon wafer by using a spin coater, and cured at 200° C. for 30 minutes to form a passivation film. The formed film was immersed in 1-methyl-2-pyrrolidone at 23° C. for 1 minute, and then solvent-tolerance of the film was evaluated with a percentage of a residual film.

<Evaluation of Heat-Tolerance>

Each of compositions for forming passivation films obtained in Examples 1 to 4 and Comparative Examples 1 to 3 was applied onto a silicon wafer by using a spin coater, and cured at 200° C. for 30 minutes to form a passivation film. The temperature of the formed film in a TG-DTA (manufactured by Bruker AXS K.K., TG/DTA2010SR) was elevated at 10° C./minute, and the heat-tolerance was evaluated from a temperature at which the amount decreases by 3% by mass. The wafer was also placed on a hot plate heated at 260° C., and evaluated for whether the film has tackiness by touching with forceps.

<Evaluation of Adhesiveness>

Each of compositions for forming passivation films obtained in Examples 1 to 4 and Comparative Examples 1 to 3 was applied onto a silicon wafer by using a spin coater under the condition of 1,500 rpm, 30 seconds, and cured at 200° C. for 30 minutes to form a passivation film. The cross-cut adhesion test (JIS K5400) was conducted to the formed film, and adhesiveness was evaluated with the number of squares remained on the wafer.

<Evaluation of $O_2$ Dry Etching Property>

Each of compositions for forming passivation films obtained in Examples 1 to 4 and Comparative Examples 1 to 3 was applied onto a silicon wafer by using a spin coater, and cured at 200° C. for 30 minutes to form a passivation film. Etching was conducted for 2 minutes, by using a reactive ion etching device (RIE-10NR, manufactured by SAMCO INC.) under the oxygen flux of 50 sccm, the pressure of 12 Pa, and the RF output of 250 W, and the dry etching property of the formed film was evaluated as a reduced amount of a film thickness per 1 minute.

<Evaluation of Electrical Property>

Diluted solutions were prepared by adding solvents to compositions for forming passivation films obtained in Examples 1 to 4 and Comparative Examples 1 to 3, so that films formed on silicon wafers by using a spin coater have film thicknesses of 1 μm. Each of the prepared diluted solutions was applied onto a silicon wafer by using a spin coater, and cured at 200° C. for 30 minutes to form a passivation film. A voltage of 2 MV/cm was applied to the passivation film by using a mercury probe (CVmap 92-B, manufactured by Four Dimensions Inc.), and a leak current value and permittivity (converted to relative permittivity) were measured to evaluate electrical properties.

The evaluation results of Examples 1 to 4 and Comparative Examples 1 to 3 are shown in Table 1.

TABLE 1

| | Evaluation Items | | | | | | |
|---|---|---|---|---|---|---|---|
| | Solvent-tolerance | Heat-tolerance | | Adhesiveness | $O_2$ Dry Etching Property | Electrical Property | |
| | Percentage of a Residual Film | Temperature of 3% by mass Decrease (° C.) | 260° C. Tackiness | Number of Remained Squares | Reduced Amount of Film Thickness (nm) | Leak Current Value (A/cm$^2$) | Permittivity |
| Example 1 | 95% or greater | 371 | No | 100 | 501 | $3.94 \times 10^{-10}$ | 3.02 |
| Example 2 | 95% or greater | 359 | No | 100 | 592 | $3.65 \times 10^{-10}$ | 3.17 |
| Example 3 | 95% or greater | 338 | No | 100 | 507 | $3.91 \times 10^{-10}$ | 3.32 |
| Example 4 | 95% or greater | 346 | No | 100 | 490 | $4.68 \times 10^{-10}$ | 3.13 |
| Comparative Example 1 | 79% | 400 | No | 100 | 51 | $2.27 \times 10^{-9}$ | 2.71 |
| Comparative Example 2 | 95% or greater | 272 | No | 0 | 703 | $7.08 \times 10^{-6}$ | 4.29 |

TABLE 1-continued

| | Evaluation Items | | | | | | |
|---|---|---|---|---|---|---|---|
| | Solvent-tolerance | Heat-tolerance | | Adhesiveness | O$_2$ Dry Etching Property | Electrical Property | |
| | | | | | | Leak | |
| | Percentage of a Residual Film | Temperature of 3% by mass Decrease (° C.) | 260° C. Tackiness | Number of Remained Squares | Reduced Amount of Film Thickness (nm) | Current Value (A/cm$^2$) | Permittivity |
| Comparative Example 3 | 0% | 481 | Yes | 100 | 347 | — | — |

As shown in Table 1, the passivation films obtained from the present invention showed good values for all of solvent-tolerance, heat-tolerance, adhesiveness, O$_2$ dry etching properties, and electrical properties.

The passivation films using polymers obtained in Synthesis Examples 2 to 18 also showed results comparable to those from Examples 1 to 4.

By contrast, with the benzocyclobutene resin of Comparative Example 1, sufficient solvent-tolerance was not obtained by curing at a low temperature and a short time, that is, 200° C. and 30 minutes. In addition, the O$_2$ dry etching property was also insufficient with this resin.

With the polyimide resin of Comparative Example 2, imidization was not sufficiently proceeded, and thus dehydration resulting from moisture absorption and progress of imidization markedly decreased thermogravimetry. Electrical properties were extremely poor with this resin, and adhesiveness to the wafer was also not obtained because of high internal stress resulting from heat shrinkage.

Since the aromatic polyether of Comparative Example 3 does not have any thermal cross-linking groups, solvent-tolerance was not obtained at all, and moreover, the film was melted at 260° C.

INDUSTRIAL APPLICABILITY

A passivation film obtained from a composition for forming a passivation film of the present invention has excellent solvent-tolerance, heat-tolerance, adhesiveness, O$_2$ dry etching properties, electrical properties and the like. By utilizing such properties, a passivation film of the present invention can be used as a film protecting an IC circuit formed on a wafer, a film protecting an electrode formed on the rear surface of a wafer, and the like.

The invention claimed is:

1. A composition for forming a passivation film, comprising:

a polymer containing a unit structure of Formula (1):

   Formula (1)

where the polymer is a homopolymer having one type of unit structure, and

L$^1$ is a divalent group of Formula (3) or a divalent group of Formula (4):

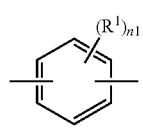   Formula (3)

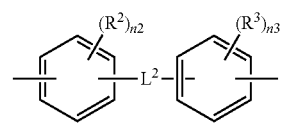   Formula (4)

where

R$^1$ is a group containing at least a cyano group,

R$^2$ and R$^3$ are independently a C$_{1-10}$ alkyl group, a C$_{1-4}$ fluoroalkyl group, a hydroxy group, an allyl group, an allyloxy group, an amino group, a cyano group, a nitro group, an acyl group, an acyloxy group, a carboxy group, a group containing a tertiary-carbon structure, a cyclic alkyl group, or a combination of these, L$^2$ is a sulfonyl group, a carbonyl group, an ester group, an amido group, a sulfinyl group, or a sulfonamido group, n1 is an integer of 1 to 4, and each of n2 and n3 is an integer of 0 to 4; and T$^1$ is a combination of an arylene group having two substituents and a fluoroalkylene group, wherein the arylene group is a phenylene group, a naphthylene group or an anthrylene group, and the substituents on the arylene group are *—N(—CH$_2$—C≡CH)$_2$ in which * is a bonding part, such that the polymer contains, at a terminal or in a side chain or the main chain, a plurality of groups containing a structure of Formula (2-A), and optionally at least one group containing a structure of Formula (2-B):

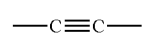   Formula (2-A)

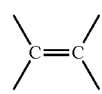   Formula (2-B)

wherein when Formula (2-A) and Formula (2-B) exist at a terminal or in a side chain of the homopolymer, they are the following monovalent groups: —C≡CH, —CH═CH$_2$, respectively, and when Formula (2-A) and Formula (2-B) exist in the main chain of the homopolymer, they are a divalent group or a tetravalent group, respectively.

2. The composition for forming a passivation film according to claim 1, wherein in Formula (4), L$^2$ is a sulfonyl group or a carbonyl group.

3. The composition for forming a passivation film according to claim 1, further comprising:

a polymer containing a unit structure of Formula (7):

  Formula (7)

where $L^3$ is Formula (3) or Formula (4):

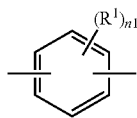  Formula (3)

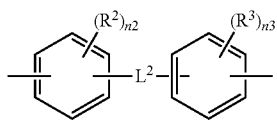  Formula (4)

where $R^1$, $R^2$, $R^3$, $L^2$, n1, n2, and n3 are the same as defined above; and $T^3$ is an alkylene group, a sulfonyl group, a carbonyl group, a $C_{6-30}$ arylene group optionally having a substituent, or a combination of any of these groups.

4. The composition for forming a passivation film according to claim 1, wherein the arylene group is a naphthylene group, or an anthrylene group.

5. The composition for forming a passivation film according to claim 3, wherein $T^3$ is a group of Formula (8):

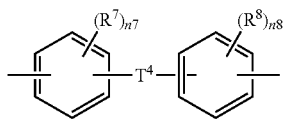  Formula (8)

where each of $R^7$ and $R^8$ is a $C_{1-10}$ alkyl group, a $C_{1-4}$ fluoroalkyl group, a hydroxy group, an allyl group, an allyloxy group, an amino group, a cyano group, a nitro group, an acyl group, an acyloxy group, a carboxy group, a group having a tertiary carbon atom, a cycloalkyl group, or a combination of any of these groups;

each of n7 and n8 is an integer of 0 to 4; and $T^4$ is an alkylene group, a sulfonyl group, a carbonyl group, a $C_{6-30}$ arylene group optionally having a substituent, or a combination of any of these groups.

6. The composition for forming a passivation film according to claim 1, wherein the group having a tertiary carbon atom is a tertiary butyl group.

7. The composition for forming a passivation film according to claim 1, wherein a weight-average molecular weight of the homopolymer is from 500 to 5,000,000.

8. The composition for forming a passivation film according to claim 1, further comprising a solvent.

9. A passivation film obtained by applying the composition for forming a passivation film as claimed in claim 1 to a substrate, and baking the substrate.

10. The passivation film according to claim 9, wherein the passivation film is used as a film protecting an IC circuit formed on a wafer.

11. The passivation film according to claim 9, wherein the passivation film is used as a film protecting an electrode formed on a rear surface of a wafer.

12. The composition for forming a passivation film according to claim 1, wherein $L^1$ is a divalent group of Formula (3) in which $R^1$ is a group containing at least a cyano group, and n1 is an integer of 1 to 4.

* * * * *